(12) United States Patent
Karlgaard et al.

(10) Patent No.: US 11,506,693 B2
(45) Date of Patent: Nov. 22, 2022

(54) METER AND SOCKET FOR USE WITH A DISTRIBUTED ENERGY RESOURCE DEVICE

(71) Applicant: Landis+Gyr Innovations, Inc., Alpharetta, GA (US)

(72) Inventors: Matt Karlgaard, Brainerd, MN (US); John Radgowski, Pequot Lakes, MN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 235 days.

(21) Appl. No.: 16/836,244

(22) Filed: Mar. 31, 2020

(65) Prior Publication Data
US 2021/0109142 A1 Apr. 15, 2021

Related U.S. Application Data

(60) Provisional application No. 62/914,205, filed on Oct. 11, 2019.

(51) Int. Cl.
*G01R 22/06* (2006.01)
*G01R 11/04* (2006.01)
(Continued)

(52) U.S. Cl.
CPC ............ *G01R 22/065* (2013.01); *G01R 11/04* (2013.01); *G01R 22/068* (2013.01); *H01R 13/113* (2013.01); *H02H 1/0007* (2013.01)

(58) Field of Classification Search
CPC ... G01R 11/02; G01R 11/04; G01R 11/30–34; G01R 11/48–54;
(Continued)

(56) References Cited

U.S. PATENT DOCUMENTS

| 4,463,311 A | 7/1984 | Kobayashi |
| 4,977,482 A | 12/1990 | Langdon et al. |

(Continued)

FOREIGN PATENT DOCUMENTS

| CN | 1403825 | 3/2003 |
| CN | 201467023 | 5/2010 |

(Continued)

OTHER PUBLICATIONS

Milbank Manufacturing, "Recreational Vehicle Park", Product Sheet available at https://www.milbankworks.com/getmedia/24191e24-6c65-4ffb-a468-9c98e6ec6f68/Recreational-Vehicle-Park-Electrical-Products.pdf at least as early as Apr. 2019, 32 pages.

(Continued)

*Primary Examiner* — Huy Q Phan
*Assistant Examiner* — David B Frederiksen
(74) *Attorney, Agent, or Firm* — Kilpatrick Townsend & Stockton LLP

(57) ABSTRACT

An electric meter socket includes a first connection path within the electric meter socket to form a first electrical connection between a distributed energy resource (DER) meter and line voltage wirings from an electric distribution system. The electric meter socket further includes a second connection path within the electric meter socket to form a second electrical connection between the DER meter and neutral wires of the electric distribution system, a DER device, and a load. Additionally, the electric meter socket includes a third connection path within the electric meter socket to form a third electrical connection between the DER meter and output voltage wirings of the DER device. Further, the electric meter socket includes a DER connector positioned on a side of the electric meter socket to receive the output voltage wirings of the DER device and to elec- (Continued)

trically couple the output voltage wirings to the third connection path.

18 Claims, 17 Drawing Sheets

(51) Int. Cl.
   *H01R 13/11* (2006.01)
   *H02H 1/00* (2006.01)
(58) Field of Classification Search
   CPC ............ G01R 22/06–10; H02H 1/0007; H01R 13/10–14; H02J 7/34
   See application file for complete search history.

(56) References Cited

U.S. PATENT DOCUMENTS

| | | | |
|---|---|---|---|
| 5,572,396 | A | 11/1996 | Robinson |
| 6,188,145 | B1 | 2/2001 | Stewart |
| 6,420,801 | B1 | 7/2002 | Seefeldt |
| 7,182,632 | B1* | 2/2007 | Johnson, Jr. ......... G01R 22/065 |
| | | | 439/146 |
| 7,274,305 | B1 | 9/2007 | Luttrell |
| 7,298,134 | B2 | 11/2007 | Weikel et al. |
| 7,648,389 | B1 | 1/2010 | Scott et al. |
| 8,049,642 | B2 | 11/2011 | Makinson et al. |
| 8,207,865 | B2 | 6/2012 | Kopp et al. |
| 8,212,687 | B2 | 7/2012 | Makinson et al. |
| 8,784,130 | B2 | 7/2014 | Scott et al. |
| 9,088,182 | B2 | 7/2015 | Kuniyosi et al. |
| 9,318,861 | B2 | 4/2016 | Fulton et al. |
| 9,391,414 | B2 | 7/2016 | Seals |
| 9,437,986 | B2 | 9/2016 | Knauer et al. |
| 9,484,653 | B1 | 11/2016 | Chen |
| 9,500,672 | B1 | 11/2016 | Bautista et al. |
| 9,595,815 | B2 | 3/2017 | Knauer et al. |
| 9,620,305 | B2 | 4/2017 | Miller et al. |
| 9,627,861 | B2 | 4/2017 | Cruz |
| 9,960,637 | B2 | 5/2018 | Sanders et al. |
| 9,995,768 | B2 | 6/2018 | Parks et al. |
| 10,132,838 | B2 | 11/2018 | Parks et al. |
| 2002/0075622 | A1 | 6/2002 | Robinson |
| 2002/0171436 | A1 | 11/2002 | Russell |
| 2003/0034693 | A1 | 2/2003 | Wareham et al. |
| 2004/0036362 | A1 | 2/2004 | Beck et al. |
| 2005/0027464 | A1 | 2/2005 | Jonker et al. |
| 2008/0091625 | A1 | 4/2008 | Kremen |
| 2008/0266133 | A1* | 10/2008 | Martin .................... G01D 4/002 |
| | | | 340/870.02 |
| 2009/0121705 | A1 | 5/2009 | Rzehak |
| 2010/0003848 | A1 | 1/2010 | Scott et al. |
| 2010/0105226 | A1 | 4/2010 | Gong et al. |
| 2010/0225305 | A1* | 9/2010 | Reineccius ............ G01R 22/06 |
| | | | 324/126 |
| 2010/0306027 | A1 | 12/2010 | Haugh |
| 2012/0278016 | A1* | 11/2012 | Huff ..................... G01R 21/133 |
| | | | 702/62 |
| 2013/0106397 | A1 | 5/2013 | Fulton et al. |
| 2013/0123997 | A1 | 5/2013 | King et al. |
| 2013/0211754 | A1 | 8/2013 | Herzog et al. |
| 2013/0226485 | A1 | 8/2013 | Pietrowicz et al. |
| 2014/0127935 | A1 | 5/2014 | Scott et al. |
| 2014/0218010 | A1 | 8/2014 | Fulton et al. |
| 2015/0061644 | A1 | 3/2015 | Parks et al. |
| 2015/0233980 | A1 | 8/2015 | Umetsu et al. |
| 2015/0285844 | A1 | 10/2015 | May |
| 2015/0309075 | A1 | 10/2015 | Parks et al. |
| 2016/0056571 | A1 | 2/2016 | Hamaoka et al. |
| 2016/0061870 | A1 | 3/2016 | Vaculik et al. |
| 2016/0131688 | A1* | 5/2016 | Carlson .................. G01R 22/10 |
| | | | 702/61 |
| 2016/0141784 | A1 | 5/2016 | Hashiguchi |
| 2016/0181752 | A1 | 6/2016 | Parks et al. |
| 2016/0181807 | A1* | 6/2016 | Day ....................... H02J 3/32 |
| | | | 307/31 |
| 2016/0320427 | A1 | 11/2016 | Bautista et al. |
| 2016/0380413 | A1 | 12/2016 | Cruz |
| 2017/0168516 | A1 | 6/2017 | King |
| 2017/0194792 | A1 | 7/2017 | Zimmanck et al. |
| 2017/0212160 | A1 | 7/2017 | Fulton et al. |
| 2017/0214225 | A1 | 7/2017 | Ramachandran et al. |
| 2017/0229827 | A1 | 8/2017 | Michelmann et al. |
| 2017/0346296 | A1 | 11/2017 | Schamber et al. |
| 2018/0083446 | A1 | 3/2018 | Kern |
| 2018/0109047 | A1 | 4/2018 | Hoang et al. |
| 2018/0246150 | A1 | 8/2018 | Cook |
| 2019/0140455 | A1* | 5/2019 | Wong .................... G06N 7/005 |
| 2020/0225263 | A1 | 7/2020 | Karlgaard |

FOREIGN PATENT DOCUMENTS

| | | |
|---|---|---|
| CN | 201623651 | 11/2010 |
| CN | 101976854 | 2/2011 |
| CN | 202110217 | 1/2012 |
| CN | 102882237 | 1/2013 |
| CN | 103138291 | 6/2013 |
| CN | 103187735 | 7/2013 |
| CN | 203368046 | 12/2013 |
| CN | 103545926 | 1/2014 |
| CN | 105242087 | 1/2016 |
| CN | 103645363 | 9/2016 |
| FR | 3002642 | 8/2014 |
| JP | 06153527 | 5/1994 |
| JP | 2001090296 | 4/2001 |
| JP | 2008283764 A | 11/2008 |
| JP | 2010283936 A | 12/2010 |
| JP | 2011204045 | 10/2011 |
| JP | 2012228043 | 11/2012 |
| JP | 2012244665 | 12/2012 |
| JP | 2014230454 | 12/2014 |
| JP | 2015156728 A | 8/2015 |
| WO | 03014748 | 2/2003 |
| WO | 2003014748 | 3/2003 |
| WO | 2011124657 | 10/2011 |
| WO | 2013057516 | 12/2013 |
| WO | 2014002798 | 1/2014 |
| WO | 2014192015 | 12/2014 |
| WO | 2016167722 | 10/2016 |

OTHER PUBLICATIONS

U.S. Appl. No. 16/244,701, Notice of Allowance, dated Oct. 28, 2020, 7 pages.
"Conzerv EM6438_EM6436 Dual Source Energy Meters User Manual", available online at https://download.schneider-electric.com/files?p_enDocType=User+guide&p_File_Name=NHA12537-03.pdf&p%20Doc%20Ref=NHA12537, Dec. 31, 2015, 76 pages.
International Patent Application No. PCT/US2020/054422, International Search Report and Written Opinion, dated Jan. 18, 2021, 12 pages.
U.S. Appl. No. 16/244,701, Non-Final Office Action dated Jul. 23, 2020, 12 pages.
International Patent Application No. PCT/US2020/012485, International Search Report and Written Opinion dated Apr. 20, 2020, 12 pages.
Unpublished U.S. Appl. No. 16/428,118, filed May 31, 2019.
Unpublished U.S. Appl. No. 16/793,876, filed Feb. 18, 2020.
U.S. Appl. No. 17/038,930, Non-Final Office Action dated Jun. 7, 2021, 21 pages.
European Patent Application No. 21206310.1, Office Action, dated Jun. 29, 2022, 3 pages.
Canadian Patent Application No. 3,024,185, Notice of Allowance, dated Jul. 20, 2022, 1 page.
Japanese Patent Application No. 2022-046586, Office Action, dated Aug. 2, 2022, 4 pages.

* cited by examiner

METER AND SOCKET FOR USE WITH A DISTRIBUTED ENERGY RESOURCE DEVICE

CROSS-REFERENCE TO RELATED APPLICATIONS

This application claims benefit of and priority to U.S. Provisional Application Ser. No. 62/914,205, filed Oct. 11, 2019, and is titled "METER AND SOCKET FOR USE WITH A DISTRIBUTED ENERGY RESOURCE DEVICE," the entire contents of which are hereby incorporated by this reference.

TECHNICAL FIELD

This disclosure relates generally to an electric meter and socket. More particularly, this disclosure relates to an electric meter and socket for use with a distributed energy resource device.

BACKGROUND

Distributed energy resource (DER) devices, for example, solar panels, wind turbines, electric vehicle batteries, etc. are typically wired into the grid with a connection into a circuit breaker in an electrical panel within a customer's premises. If metering of the DER device is required, a separate meter is typically mounted on the customer's wall for this purpose. One or more disconnect switches are typically also mounted on the customer's wall.

There is an increase in the use of DER devices by energy consumers, including residential consumers. Currently, when a consumer wants to connect a DER device at a premises, a utility and an electrician installing the DER device must coordinate and be on the premises at the same time. The utility disconnects the power to the meter socket. After the power is disconnected, the electrician connects the DER device "behind the meter." In some installations, a separate meter for the DER device may be required. After the DER device is installed, the utility re-connects the power to the meter socket. A system and technique for connecting a DER device to an existing service without coordination between the utility and the electrician is desirable.

SUMMARY

Systems for connecting distributed energy resource devices with distributed energy resource meters are provided.

According to various aspects of the present disclosure, an electric meter socket includes at least one first connection path within the electric meter socket to form a first electrical connection between a distributed energy resource (DER) meter and line voltage wirings from an electric distribution system. The electric meter socket further includes at least one second connection path within the electric meter socket to form a second electrical connection between the DER meter and neutral wires of the electric distribution system, a DER device, and a load. Additionally, the electric meter socket includes at least one third connection path within the electric meter socket to form a third electrical connection between the DER meter and output voltage wirings of the DER device. Further, the electric meter socket includes a DER connector positioned on a side of the electric meter socket. The DER connector receives the output voltage wirings of the DER device to electrically couple the output voltage wirings to the at least one third connection path.

In another example, a system includes an electric meter and an electric meter socket that mates with the electric meter. The electric meter socket includes at least one first connection path within the electric meter socket to form a first electrical connection between the electric meter and line voltage wirings of an electric distribution system. The electric meter socket also includes at least one second connection path within the electric meter socket to form a second electrical connection between the electric meter and neutral wires of the electric distribution system, a distributed energy resource (DER) device, and a load. Additionally, the electric meter socket includes at least one third connection path within the electric meter socket to form a third electrical connection between the electric meter and output voltage wirings of the DER device. Further, the electric meter socket includes a DER connector positioned on a side of the electric meter socket. The DER connector receives the output voltage wirings of the DER device to electrically couple the output voltage wirings to the at least one third connection path. The system also includes a controllable electrical disconnect switch that connects and disconnects the DER device from the electric distribution system based on power production or consumption requirements of the electric distribution system and the DER device.

In another example, a system for connecting and metering a distributed energy resource (DER) device includes an electric meter. The electric meter includes at least one controllable electrical disconnect switch that connects and disconnects the DER device from an electric distribution system based on power production or consumption requirements of the electric distribution system and the DER device. The system further includes an electric meter socket that electrically couples to the electric meter. The electric meter socket includes at least one first connection path within the electric meter socket to form a first electrical connection between the electric meter and line voltage wirings of an electric distribution system. The electric meter socket also includes at least one second connection path within the electric meter socket to form a second electrical connection between the electric meter and neutral wires of the electric distribution system, the DER device, and a load. Additionally, the electric meter socket includes at least one third connection path within the electric meter socket to form a third electrical connection between the electric meter and output voltage wirings of the DER device. Further, the electric meter socket includes at least one fourth connection path within the electric meter socket to form a fourth electrical connection between the electric meter and the load.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE DRAWINGS

Aspects and features of the various embodiments will be more apparent by describing examples with reference to the accompanying drawings, in which.

DETAILED DESCRIPTION

While certain examples are described herein, these examples are presented by way of example only, and are not intended to limit the scope of protection. The apparatuses and systems described herein may be embodied in a variety of other forms. Furthermore, various omissions, substitutions, and changes in the form of the example methods and systems described herein may be made without departing from the scope of protection.

Systems are provided for connecting distributed energy resource (DER) devices with metering devices. Currently there is no standard system for connecting DER devices to the grid. Existing systems often rely on coordination between a utility that owns a utility metering device and an electrician installing the DER device. For example, the utility may be required to remove the utility metering device while the electrician is on premises to install the DER device. Upon installation of the DER device, the utility has to reinstall the utility metering device.

A DER-enabled meter socket is described herein that provides a mechanism to connect a DER device with the DER-enabled meter socket at a customer premises without removing the utility metering device by the utility. For the purpose of this disclosure, a DER device is defined as any resource on an electric distribution system (i.e., a grid) that produces or stores electricity that can be provided to the distribution system, or any large load device that can be controlled to manage overall peak load of the distribution system. For example, the DER device may be a residential solar installation or a residential wind turbine installation, with or without local battery storage.

Figure 1:
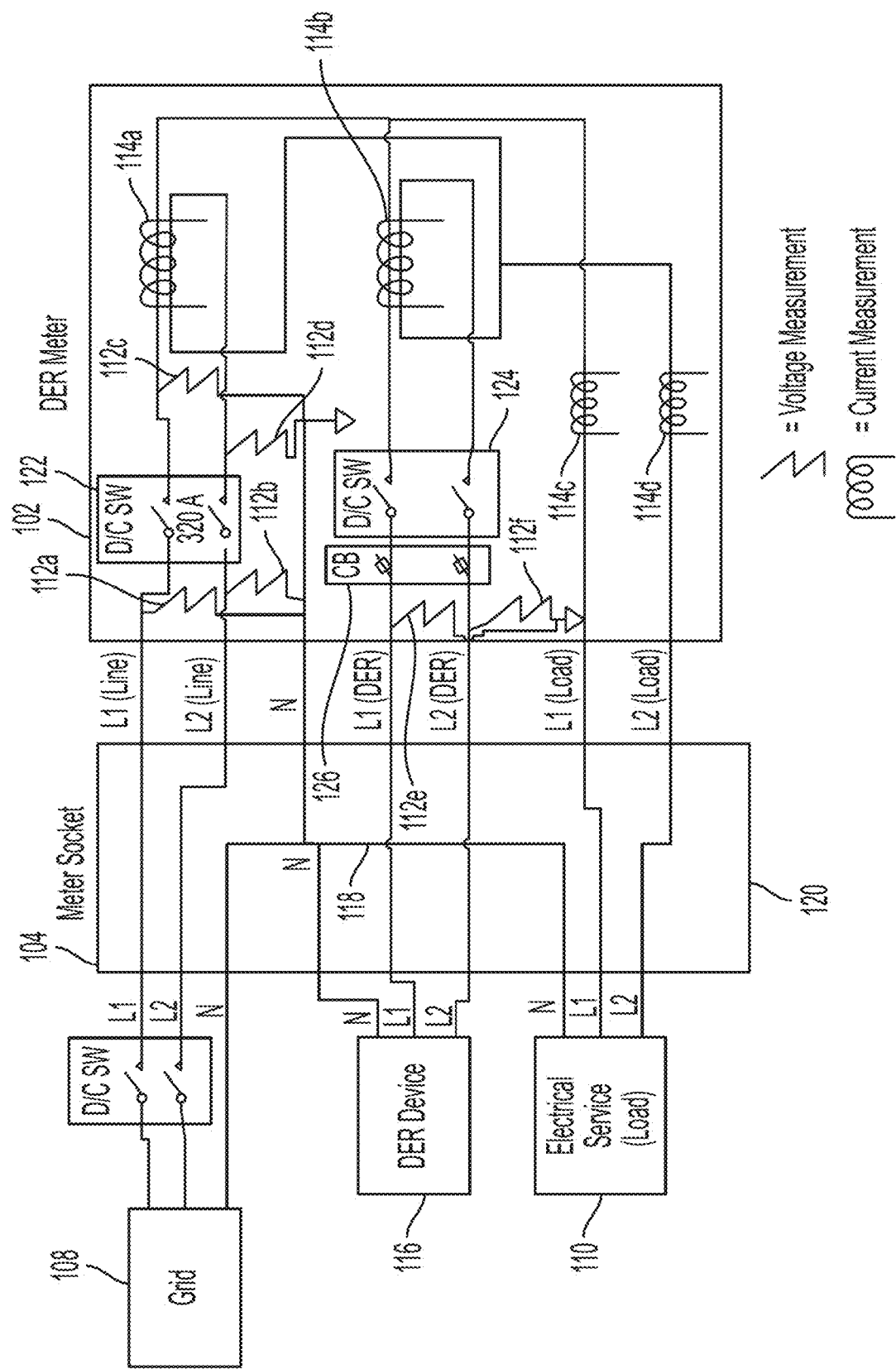
FIG. 1 is a block diagram illustrating electrical connections between a distributed energy resource (DER) meter and a meter socket in accordance with various aspects of the present disclosure.

FIG. 1 is a block diagram 100 illustrating electrical connections between a distributed energy resource (DER) meter 102 and a meter socket 104 in accordance with various aspects of the present disclosure. The DER meter 102 and the meter socket 104 are located at a customer premises (e.g., a residential building, a commercial building, etc.). The DER meter 102 measures and controls electricity delivered to the customer premises via an electric distribution system (i.e., a grid 108) and electricity generated or otherwise stored at the customer premises via a DER device (i.e., a DER device 116). Accordingly, the DER meter 102 includes sufficient connection points to receive electricity provided from the grid 108, to receive electricity provided from the DER device 116, and to provide electricity to an electrical service 110.

The DER meter 102 may be combined with a communications module to enable the DER meter 102 to communicate with other meters and with a utility. As illustrated in FIG. 1, power from the grid 108 (i.e., the electric distribution system) is supplied to the meter socket 104 through electrical wiring L1 (Line) and L2 (Line). Electrical wiring L1 (Line) and L2 (Line) may provide power from two phases of the grid 108. A neutral wire N, sometimes referred to as ground, is connected between the grid 108, the electrical service 110, and the DER device 116, for example, at an electrical service panel at a residential or commercial customer premises.

The electrical service or load 110 is also connected to the meter socket 104 via corresponding electrical wiring L1 (Load) and L2 (Load). The meter socket 104 may be a standard socket, such as a 16S meter socket, that includes electrical connectors to provide electrical connections to a conventional meter when a conventional meter is plugged into the meter socket 104. An electrical connection between the grid 108 and the electrical service 110 is formed through the DER meter 102 when the DER meter 102 is plugged into the meter socket 104. Within the DER meter 102, voltage and current provided by the grid 108 to the electrical service 110 is measured, or metered, by measuring devices. The measuring devices may be, for example, voltage transducers 112 and current transducers 114 that measure electrical characteristics of voltage and current waveforms, respectively. Power delivered to the electrical service 110 may be calculated based on the voltage and current measurements.

Output wirings from the DER device 116 may also be connected at connection points within the meter socket 104. A neutral wire N connection 118 may be formed at a connection point within the meter socket 104 to connect the neutral wires from the grid 108, the DER device 116, the electrical service 110, and the DER meter 102. In one or more examples, the connection points for the DER device 116 may be positioned on a side 120 of the meter socket 104. For example, the side 120 of the meter socket 104 may be any side of the meter socket 104 that does not interface with the DER meter 102 (e.g., a side that is exposed while the meter socket 104 is coupled to the DER meter 102). Positioning the connection points on the side 120 may provide an easily accessible location for the DER device 116 to connect with the meter socket 104.

The connection points within the meter socket 104 may provide electrical connections between the meter socket 104 and the DER meter 102. For example, the connection points for the lines L1 (Line) and L2 (Line) at the meter socket 104 from the grid 108 may electrically connect the lines L1 (Line) and L2 (Line) from the grid 108 to the DER meter 102. Similarly, the lines L1 and L2 from the DER device 116 and the lines L1 (Load) and L2 (Load) to the electrical service 110 may be electrically connected to the DER meter 102 through the connection points within the meter socket 104. Similar to the lines L1 (Line) and L2 (Line) from the grid 108, the lines L1 and L2 from the DER device 116 may provide voltages having different electrical phases. Further, the connection point for the neutral wire N may also have an electrical connection in a corresponding receptacle of the meter socket 104.

The connection points (e.g., receptacles) included in the meter socket 104 may accommodate insertion of connecting components (e.g., blade connectors) on the DER meter 102 to form electrical connections between the meter socket 104 and the DER meter 102. Other electrical couplings are also contemplated between the meter socket 104, the DER device 116, and the DER meter 102. When the connecting components of the DER meter 102 are inserted into the receptacles of the meter socket 104, electrical connections may be formed between the DER meter 102 and the lines L1 (Line) and L2 (Line) from the grid 108, between the DER meter 102 and the lines L1 and L2 from the DER device 116, and between the DER meter 102 and the lines L1 (Load) and L2 (Load) to the electrical service 110. The connection points and connecting components (e.g., receptacles and blade connectors) may generally be referred to as mating connectors.

When the connecting components of the DER meter 102 are inserted into the receptacles of the meter socket 104, and when the connecting components of the DER device 116, the grid 108, and the electrical service 110 are inserted into the receptacles of the meter socket 104, an electrical connection may be formed between the neutral wire N and the DER meter 102. The electrical connection of the neutral wire N with the DER meter 102 may provide an electrical reference point to enable voltage measurements from L1 (Line) to neutral and L2 (Line) to neutral at the voltage transducers 112 within the DER meter 102. The ability to perform these voltage measurements at the DER meter 102 may allow for more advanced and higher fidelity metering than is possible with a standard 2S meter form, for example, which only has L1 (Line) and L2 (Line) connections available (i.e., no neutral N connection) and therefore can only measure line to line voltage (i.e., from L1 (Line) to L2 (Line)). The DER meter 102 may also perform current measurements on the L1 (Line) and L2 (Line) lines from the grid 108 using the current transducer 114a, the DER device 116 using the current transducer 114b, and the electrical service 110 using the current transducers 114c and 114d. The ability to perform L1 (Line) to neutral and L2 (Line) to neutral voltage measurements at the DER meter 102 as well as performing the current measurements at the DER meter 102 may enable implementation of various applications such as load disaggregation algorithms.

The lines L1 (Line) and L2 (Line) from the grid 108 may provide line voltages having different electrical phases. The different electrical phases may be generated by a local distribution transformer (e.g., a pole-mounted transformer located near the meter) or may be different electrical phases generated at a substation. Similarly, the lines L1 and L2 from the DER device 116 may provide line voltages having different electrical phases. The electrical phases of the line voltages on the lines L1 and L2 provided by the DER device 116 may be synchronized with the electrical phases of the line voltages on the lines L1 (Line) and L2 (Line) provided by the grid 108. Embodiments of meter sockets and meters in accordance with the present disclosure may include more or fewer connection points or receptacles corresponding to different phases of line voltages. For example, when only one line voltage phase is connected (e.g., phase A) fewer connection points and receptacles may be included in the meter socket since connection points for additional phases (e.g. phase B and phase C) are not needed. Similarly, when three line voltage phases are connected (e.g., phases A, B, and C) additional connection points and receptacles may be included in the meter socket.

In an example, a disconnect switch 122 is included in the DER meter 102. In such an example, the disconnect switch 122 may remain open when the voltage transducers 112a and 112b do not detect a voltage from the grid 108. Further, the disconnect switch may be used as a mechanism to synchronize voltage phases from the DER device 116 with the grid 108. For example, the voltage transducers 112c and 112d may measure the voltage supplied by the DER device 116 while the voltage transducers 112a and 112b measure the voltage supplied by the grid 108 while the disconnect switch 122 is open. Upon reaching synchronization between the DER device 116 and the grid 108 during a synchronization operation, the disconnect switch 122 may close. Further, the disconnect switch 122 may disconnect the DER meter 102 from the L1 (Line) and L2 (Line) connections to the grid 108. The ability to disconnect the DER meter 102 from the grid 108 may enable "islanding," which involves disconnecting the DER meter 102 from the grid 108 and supplying power to the electrical service 110 only from the DER device 116.

The DER meter 102 may also include an integrated, controllable electrical disconnect switch 124, a circuit breaker 126, or both, that disconnect or protect the DER device 116. For example, a single device may perform both functions of a circuit breaker and a separate electrical disconnect device to disconnect the lines L1 and L2 of the DER device 116 from the DER meter 102. In an example, the circuit breaker 126 may disconnect the DER device 116 from the DER meter 102 upon occurrence of an electrical fault. The circuit breaker 126 may be integrated into the DER meter 102. Additionally, the circuit breaker 126 may be controlled locally or remotely.

The controllable electrical disconnect switch 124 may be controlled by a processor (not shown) and a communications module (not shown) of the DER meter 102. The controllable electrical disconnect switch 124 may operate automatically to disconnect the DER device 116 from the grid 108, for example, when a high load is detected at voltage transducers 112e and 112f or when the electrical service or load 110 is disconnected from the meter. In some examples, the controllable electrical disconnect switch 124 may operate automatically to disconnect the DER device 116 from the grid 108 based on a command received from the DER meter 102 or another device. The controllable electrical disconnect switch 124 may connect or disconnect the DER device 116 with the DER meter 102. In connecting the DER device 116 to the DER meter 102, the DER meter 102 may measure power production or consumption of the DER device 116 as a separate value to the energy consumed from or sent back to the electric distribution system (i.e., the grid 108) thereby providing billable data. The billable data (i.e., consumption from the grid 108 or production fed back to the grid 108) may be metered within the electricity meter using "net metering" or similar methods. Further, the controllable electrical disconnect switch 124 may connect or disconnect the DER device 116 from the grid 108 based on power production or consumption requirements of the grid 108 and the DER device 116. Moreover, the disconnect switch 124 may be used to electrically disconnect the DER device 116 from the DER meter 102 to enable a technician to repair the DER meter 102, install the DER meter 102, or to replace the DER meter 102.

In an example, the DER disconnect switch (i.e., the controllable electrical disconnect switch 124) and the line disconnect switch (i.e., the disconnect switch 122) may be implemented with a 4-position switch. The 4-position switch may enable the following: 1. connection of the grid 108, the DER device 116, and the electrical service (load) 110; 2. connection of the grid 108 and the electrical service 110, with the DER device 116 disconnected; 3. connection of the electrical service 110 and the DER device 116, with the grid 108 disconnected; 4. disconnection of the grid 108, the DER device 116, and the electrical service 110. Advantages of using a 4-position switch instead of two 2-position switches include reducing the cost and size of the components needed to provide the switching functions.

The DER meter 102 may measure and control the electricity delivered to the electrical service 110 via the grid 108, the DER device 116, or both. The DER meter 102 may include a communications module (not shown) and a processor (not shown). The processor may be a microprocessor; however, embodiments in accordance with the present disclosure are not limited to such an implementation. For example, the processor may be a microprocessor, microcomputer, computer, microcontroller, programmable controller, or other programmable device. One of ordinary skill in the art will appreciate that other variations may be implemented without departing from the scope of the present disclosure.

The communications module may communicate via RF, cellular, PLC, or any other suitable communications technology. The communications module may receive communications via a network that include instructions for controlling the controllable electrical disconnect switch. The communications module may transmit information related to the operation of the meter and the measurements performed by the measurement devices in the meter to other devices on the network or a to central system. The communications module may also provide communication between the DER meter 102 and the DER device 116.

In accordance with various aspects of the present disclosure, where the DER device 116 includes some form of electricity generator (e.g., solar or wind electricity generation) or a storage device, the meter may use information about the electric distribution system. The information may include real-time electricity pricing or other information to make decisions and to control the DER device 116. For example, the DER meter 102 may use information to determine whether the DER device 116 should send energy to the grid 108 (e.g., from solar or battery storage, where battery storage could include batteries within an electric vehicle or similar), whether the DER device 116 should consume energy from the grid 108 (e.g., to charge storage or allow large loads such as water heaters, pool pumps, etc. to run), whether the DER device 116 should disconnect from the grid 108 (e.g., not consume energy from the grid 108 or send energy to the grid 108), or any combination thereof. Appropriate control actions may be initiated by the DER meter 102 based on the determination. One or ordinary skill in the art will appreciate that the above examples of decisions and control are not exhaustive and that other decisions and control operations may be performed without departing from the scope of the present disclosure.

Figure 2:
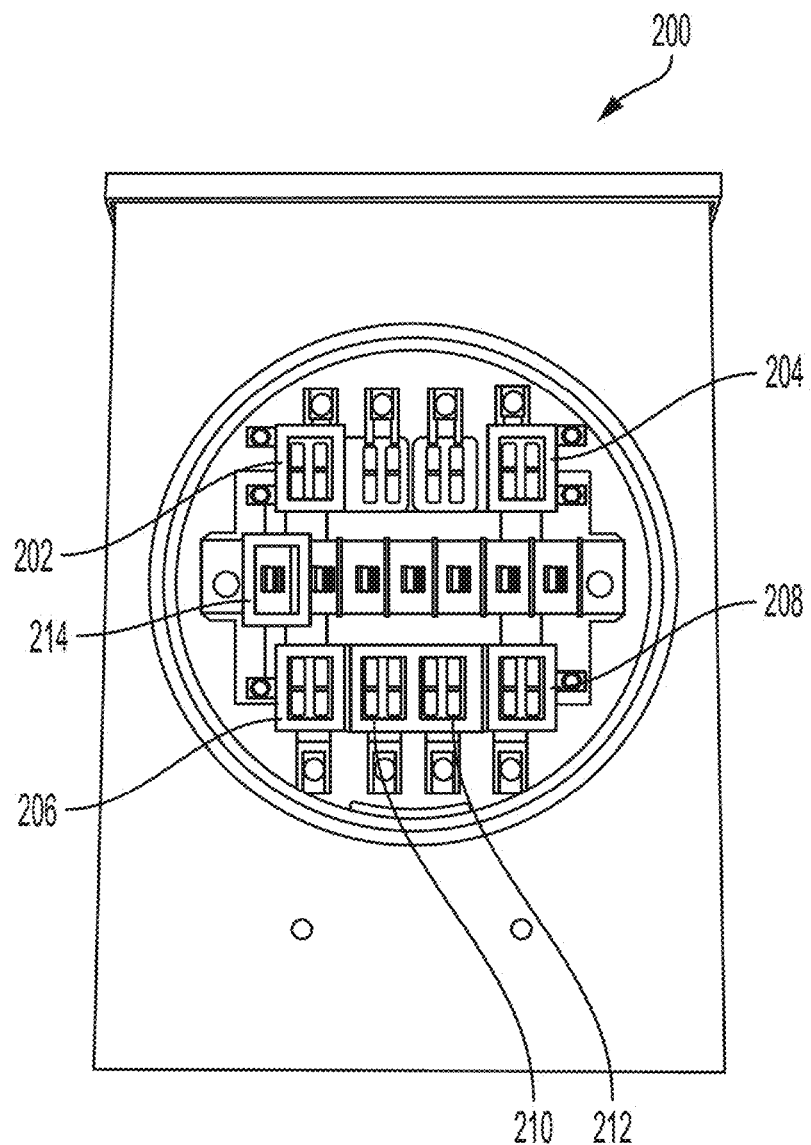
FIG. 2 is a front view of an example of a 15-terminal meter socket in accordance with various aspects of the present disclosure.

FIG. 2 is a front view of an example of a 15-terminal meter socket 200 in accordance with various aspects of the present disclosure. The illustrated meter socket 200 is a 16S meter socket. The meter socket 104, as depicted in FIG. 1, may be the 15-terminal meter socket 200. In an example, the 15-terminal meter socket 200 may be arranged to house multiple meter forms. For example, terminals 202 and 204 may be lines for the L1 (Line) and L2 (Line) described in FIG. 1 and electrically coupled to the grid 108. Terminals 206 and 208 may be lines for the L1 (Load) and the L2 (Load) described in FIG. 1 and electrically coupled to the electrical service 110. Terminals 210 and 212 may be lines for the L1 (DER) and the L2 (DER) described in FIG. 1 and electrically coupled to the DER device 116. In an example, terminal 214 may be electrically coupled to the neutral wire N described in FIG. 1.

Figure 3:
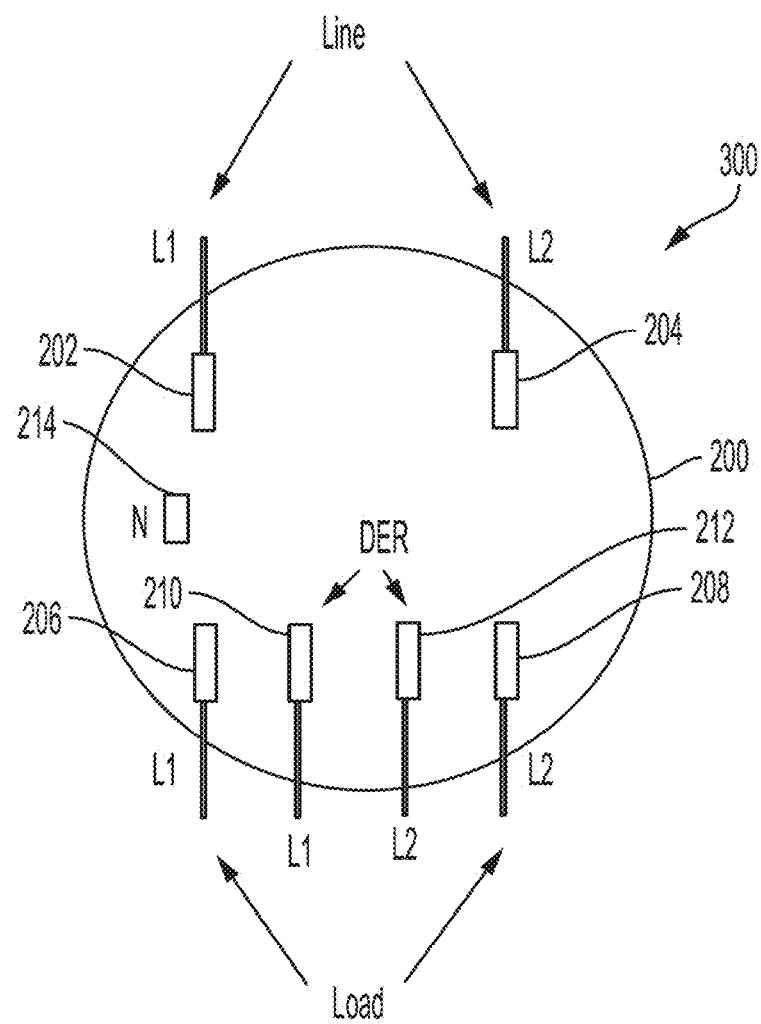
FIG. 3 is a diagram of terminals of the 15-terminal meter socket of FIG. 2 in accordance with various aspects of the present disclosure.
Figure 4:
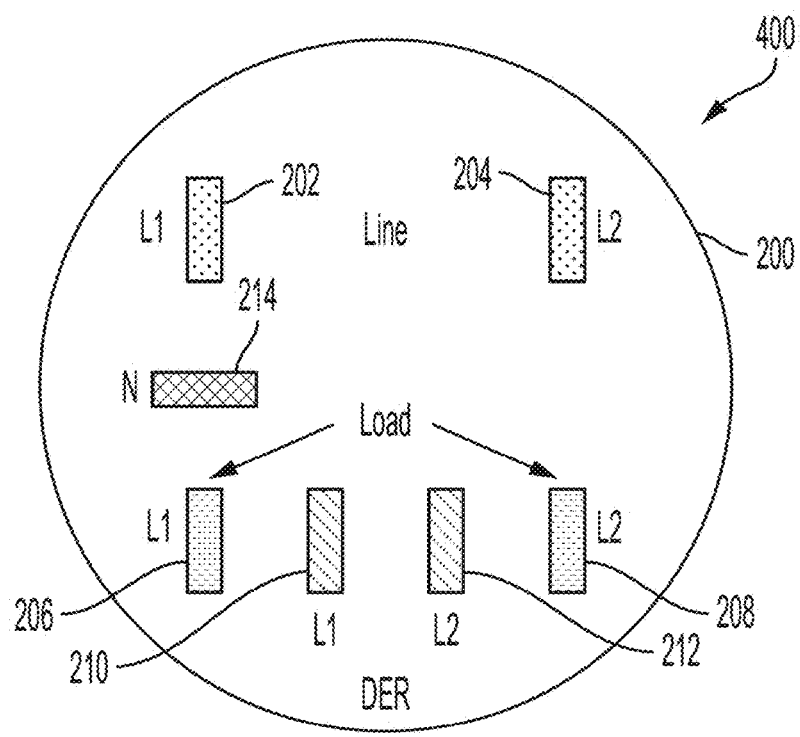
FIG. 4 is a diagram of a possible alternative configuration for a neutral terminal of the meter socket of FIG. 2 in accordance with various aspects of the present disclosure.
Figure 5:
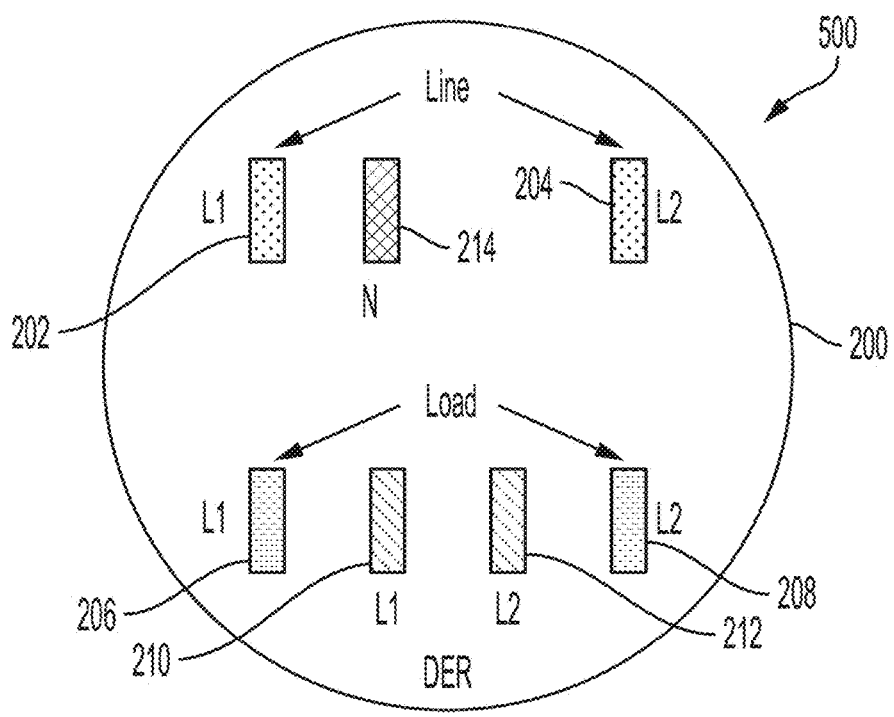
FIG. 5 is a diagram of a possible alternative configuration for a neutral terminal of the meter socket of FIG. 2 in accordance with various aspects of the present disclosure.
Figure 6:
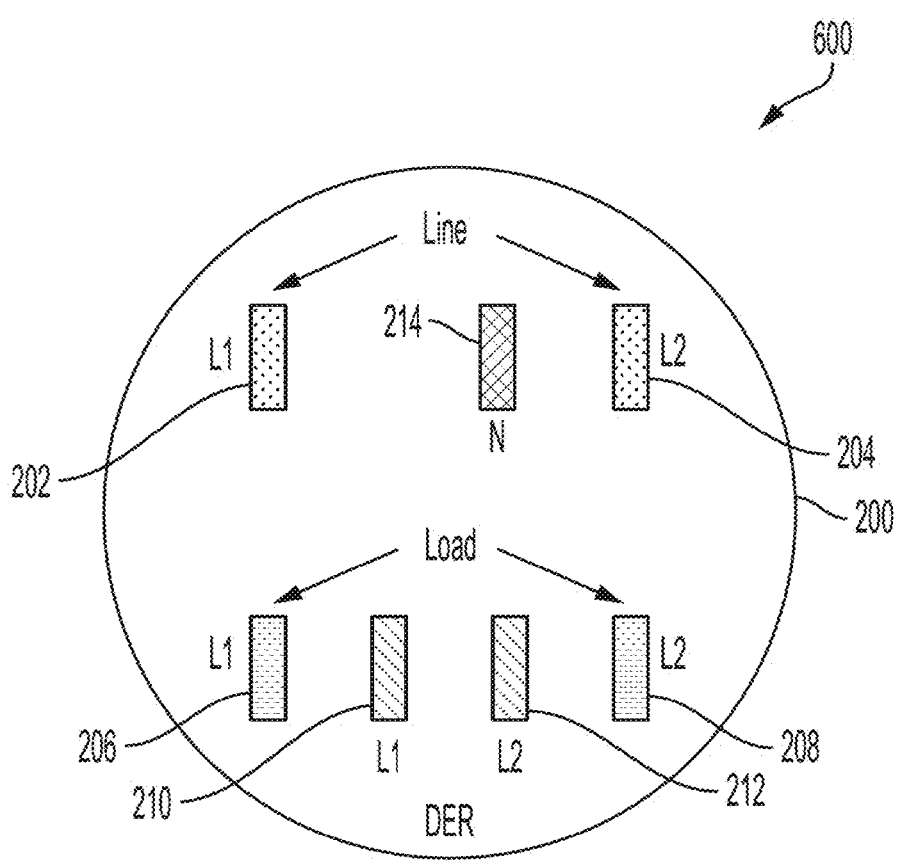
FIG. 6 is a diagram of a possible alternative configuration for a neutral terminal of the meter socket of FIG. 2 in accordance with various aspects of the present disclosure.

FIG. 3 is a diagram 300 of the terminals 202-214 of the 15-terminal meter socket 200 in accordance with various aspects of the present disclosure. The diagram 300 depicts how the terminals 202-214 of the meter socket 200 (e.g., a 16S meter socket) may be electrically coupled to the line (i.e., the grid 108), the load (i.e., the electrical service 110), the neutral wire N, and, once installed, the DER device 116. FIG. 4 is a diagram 400 of a possible alternative configuration for the neutral terminal 214 of the meter socket 200 in accordance with various aspects of the present disclosure. FIG. 5 is a diagram 500 of a possible alternative configuration for the neutral terminal 214 of the meter socket 200 in accordance with various aspects of the present disclosure. Further, FIG. 6 is a diagram 600 of a possible alternative configuration for the neutral terminal 214 of the meter socket 200 in accordance with various aspects of the present disclosure. Other arrangements are also possible, including arrangements that vary which terminals 202-214 are used for the line, the load, the neutral wire N, and the DER device 116. By providing alternative arrangements of the neutral wire N in the meter sockets 200 of FIGS. 3-6 and in the multi-port meters 1702 and 1802 of FIGS. 17 and 18 below, the meter socket 200 may be incompatible with metering devices with an incompatible arrangement of connection blades. That is, a metering device, such as the multi-port meters 1702 and 1802 of FIGS. 17 and 18, would need to be appropriately keyed to one of the meter sockets 200 in FIGS. 3-6.

Figure 7:
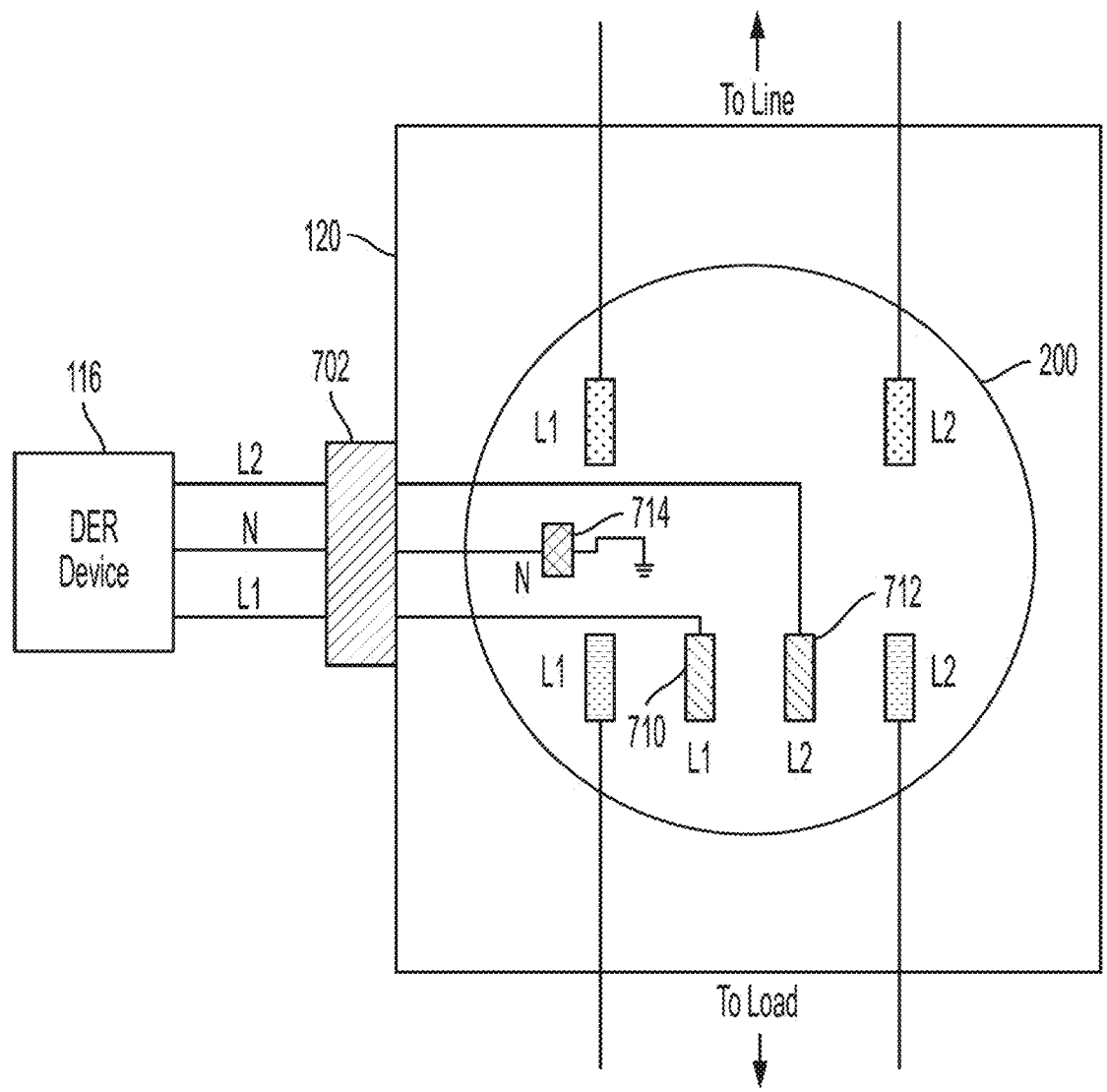
FIG. 7 is an example of the meter socket of FIG. 2 including an optional DER connector in accordance with various aspects of the present disclosure.

FIG. 7 is an example of the meter socket 200 including an optional DER connector 702 on the side 120 of the meter socket 200 in accordance with various aspects of the present disclosure. The DER connector 702 may be added to the meter socket 200 to facilitate the quick and efficient connection of a DER device 116. The DER connector 702 may be integrated into the meter socket 200 or may be an optional add-on component. FIG. 7 illustrates one example of how the DER connector 702 is connected to the DER terminals 710 and 712 and the neutral terminal 714 of the meter socket 200. The DER connector 702 is not required. If it is not used, then the DER device 116 may be connected directly to the terminals 710-714. The term DER socket is used herein to refer to the meter socket 200 configured for use with the DER device 116. The meter socket 200 of FIG. 7 is an example of a DER socket.

Figure 8:
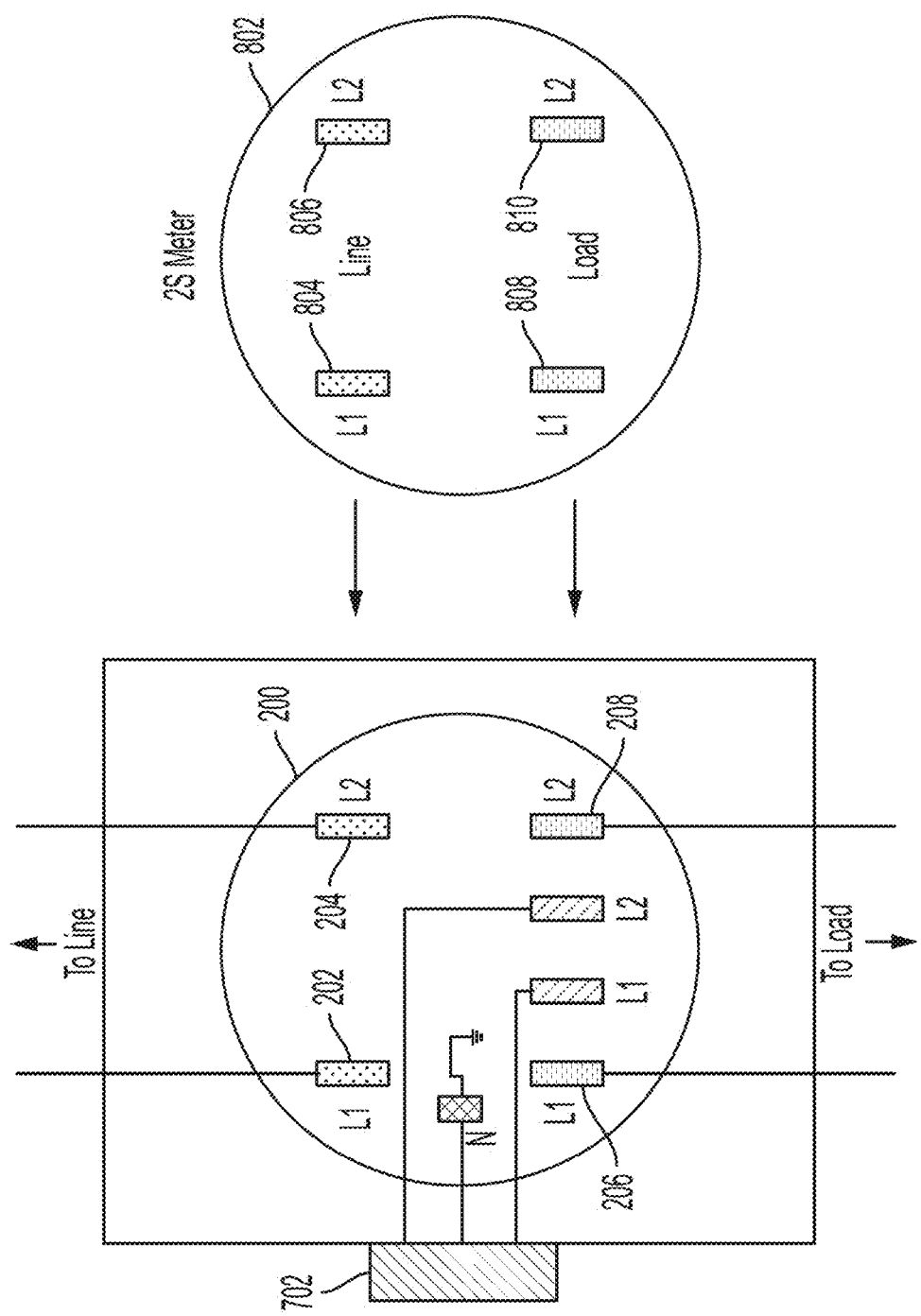
FIG. 8 is an example of a standard 2S meter that includes four blades that may be installed in the meter socket of FIG. 2 in accordance with various aspects of the present disclosure.

When the DER socket is installed, but the DER device 116 is not yet connected, a standard meter, such as a 2S meter, may be used with the DER socket. In another example, a standard meter with a neutral connection, such as a 12S meter, may also be used with the DER socket. The DER socket does not require the connection of the DER device 116 or the DER meter 102. FIG. 8 is an example of a standard 2S meter 802 that includes four blades 804, 806, 808, and 810 that may be installed in the meter socket 200 with the DER connector 702 in accordance with various aspects of the present disclosure. A 12S meter (not shown) may also be installed with a similar arrangement of blades and an additional neutral blade. Two of the blades 804 and 806 are connected to the two line terminals 202 and 204 and two of the blades 808 and 810 are connected to the two load terminals 206 and 208 of the meter socket 200. Once the 2S meter 802 is installed, the meter 802 connects the premises to the grid 108 using the line and load conductors of the meter socket 200. Even though the DER device 116 is not connected to the meter socket 200, the meter socket 200 includes the connections that make the subsequent installation of the DER device 116 easier.

To install the DER device 116 at a premises with existing service, an electrician connects the DER device 116 to the DER connector 702, and the utility replaces the 2S meter 802 with a DER meter 102. The DER meter 102 is also referred to herein as a multi-port meter. The DER connector 702 and the meter socket 200 allow these steps to occur independently. The electrician and the utility do not need to coordinate in such an instance. The electrician may connect the DER device 116 to the DER connector before or after the utility replaces the 2S meter 802.

Figure 9:
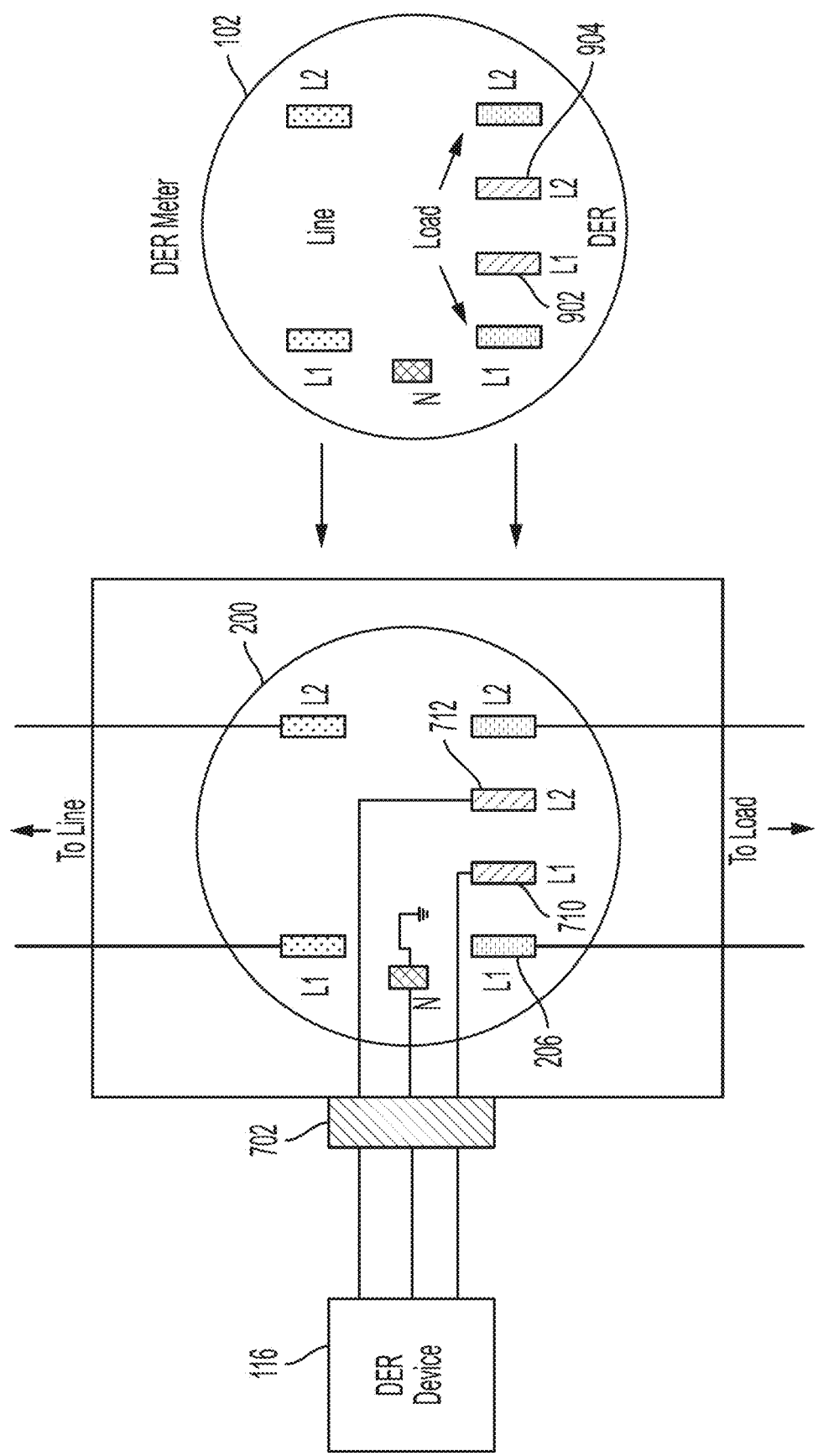
FIG. 9 is an example of a DER meter installed in the meter socket of FIG. 2 in accordance with various aspects of the present disclosure.

FIG. 9 is an example of the DER meter 102 installed in the DER-enabled meter socket 200 in accordance with various aspects of the present disclosure. The DER meter 102 uses additional blades 902 and 904 to connect to the DER device 116 through the terminals 710 and 712 of the meter socket 200 and through the DER connector 702.

Figure 10:
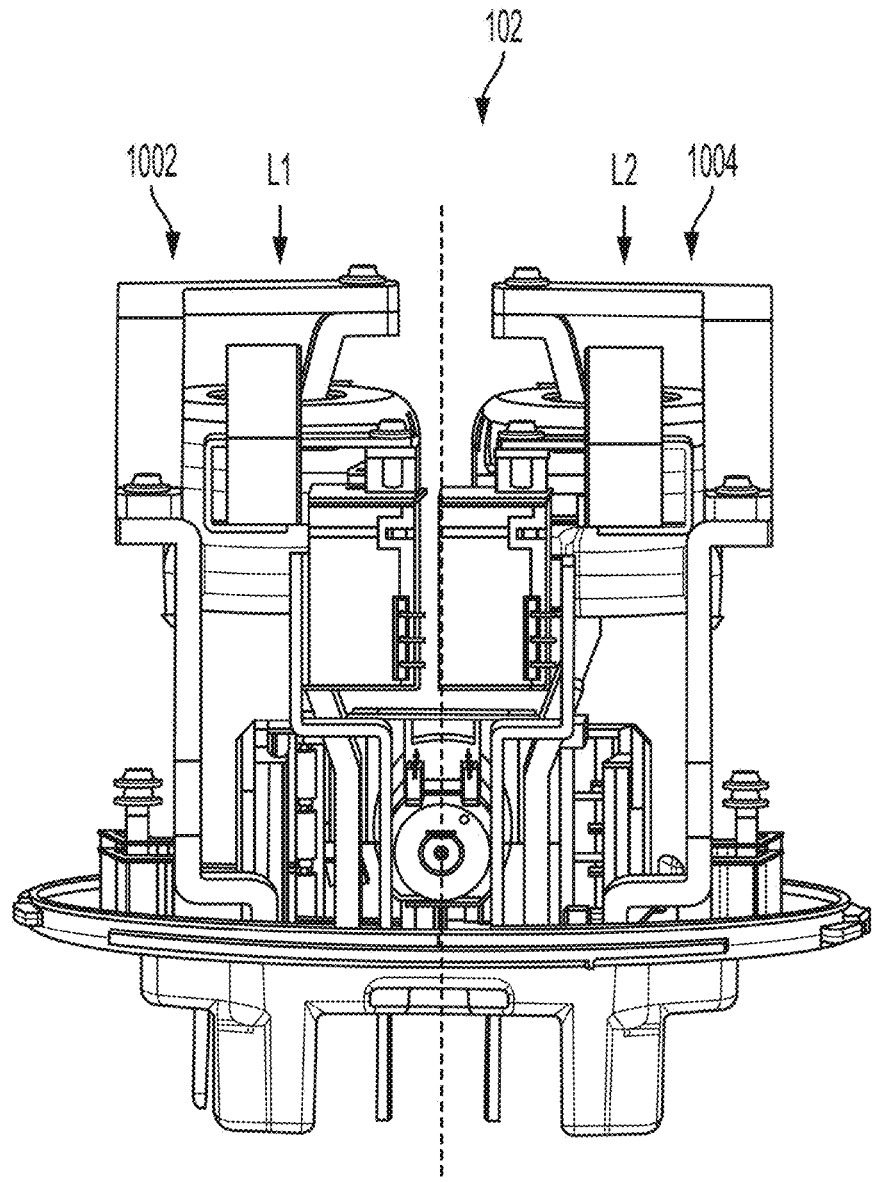
FIG. 10 is an example of a side view of the DER meter of FIG. 9 in accordance with various aspects of the present disclosure.

FIG. 10 is an example of a side view of the DER meter 102 in accordance with various aspects of the present disclosure. As illustrated, the DER meter 102 includes a symmetrical design with the L1 conductors on a left side 1002 and the L2 conductors on a right side 1004. The DER meter 102 may support billable grade metrology on the line, load, and DER ports and provides a bi-directional metering point on each of the three ports. As used herein, the term billable grade metrology may refer to a metrology system that is capable of performing metering operations to provide measurements of the amount of energy provided by the DER device 116 to the premises or the grid 108, as well as the time when the energy is provided.

Figure 11:
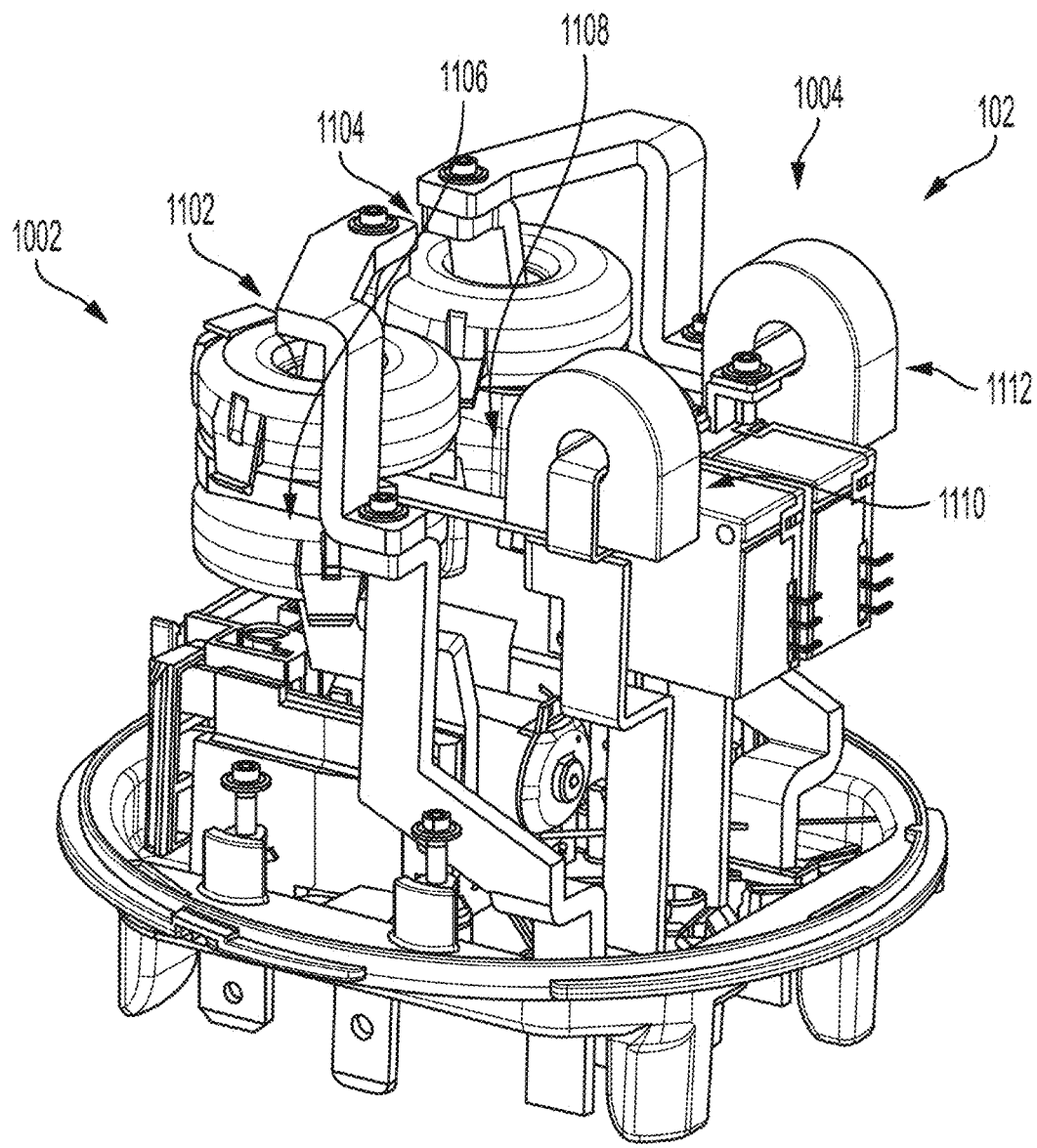
FIG. 11 is an example of a perspective view of the DER meter of FIG. 9 in accordance with various aspects of the present disclosure.

FIG. 11 is an example of a perspective view of the DER meter 102 in accordance with various aspects of the present disclosure. Load current transformers 1102 and 1104, line current transformers 1106 and 1108, and DER current transformers 1110 and 1112 are depicted in the DER meter 102. The load current transformer 1102, the line current transformer 1106, and the DER current transformer 1110 are each located on the left side 1002 of the DER meter 102, and the left side 1002 of the DER meter 102 is associated with the L1 conductors. Further, the load current transformer 1104, the line current transformer 1108, and the DER current transformer 1112 are each located on the right side 1004 of the DER meter 102, and the right side 1004 of the DER meter 102 is associated with the L1 conductors.

Figure 12:
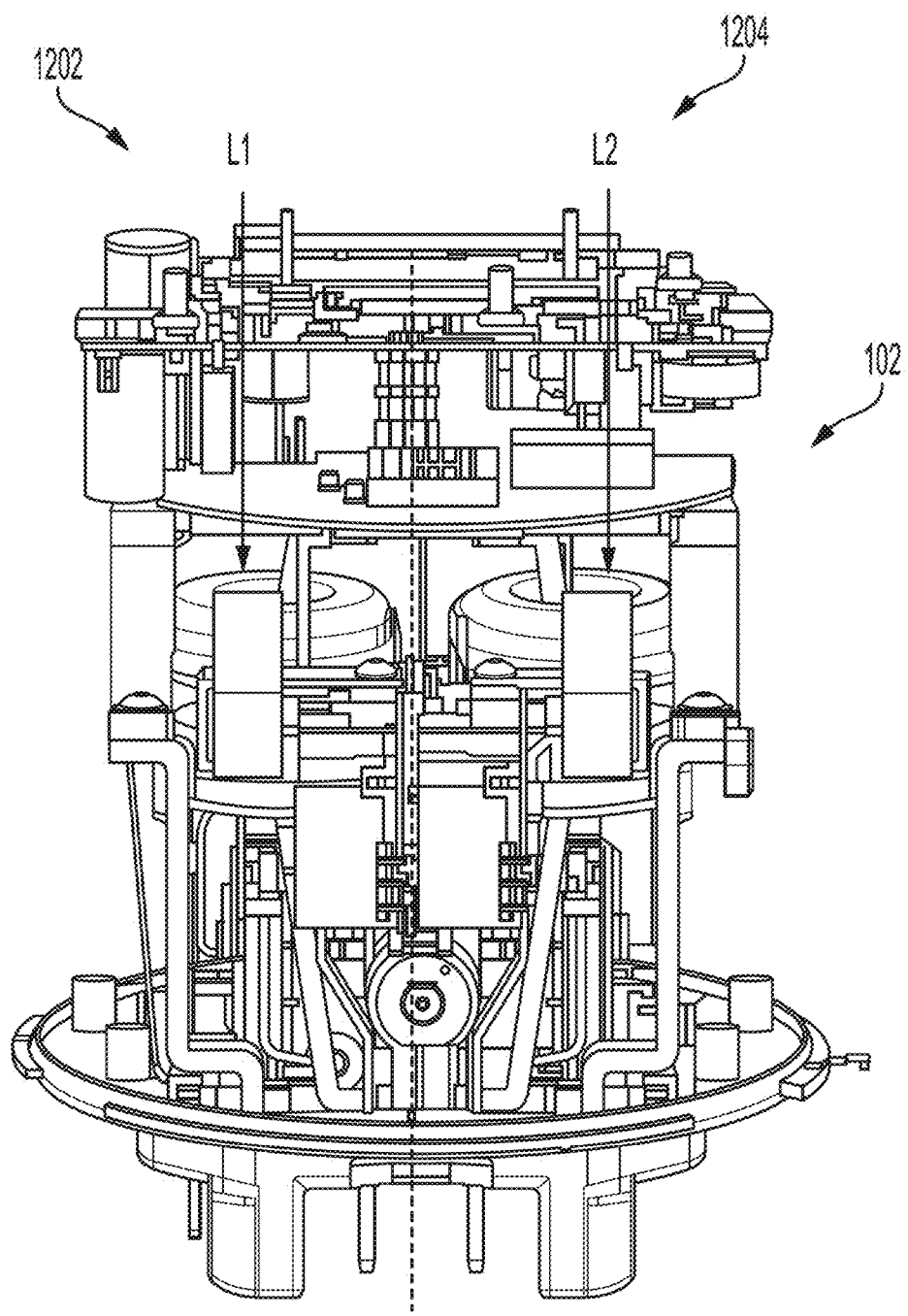
FIG. 12 is an example of a side view of an additional DER meter in accordance with various aspects of the present disclosure.

FIG. 12 is an example of a side view of an additional DER meter 102 in accordance with various aspects of the present disclosure. As illustrated, the DER meter 102 includes a symmetrical design with the L1 conductors on a left side 1202 and the L2 conductors on a right side 1204. The DER meter 102 may support billable grade metrology on the line, load, and DER ports and provides a bi-directional metering point on each of the three ports.

Figure 13:
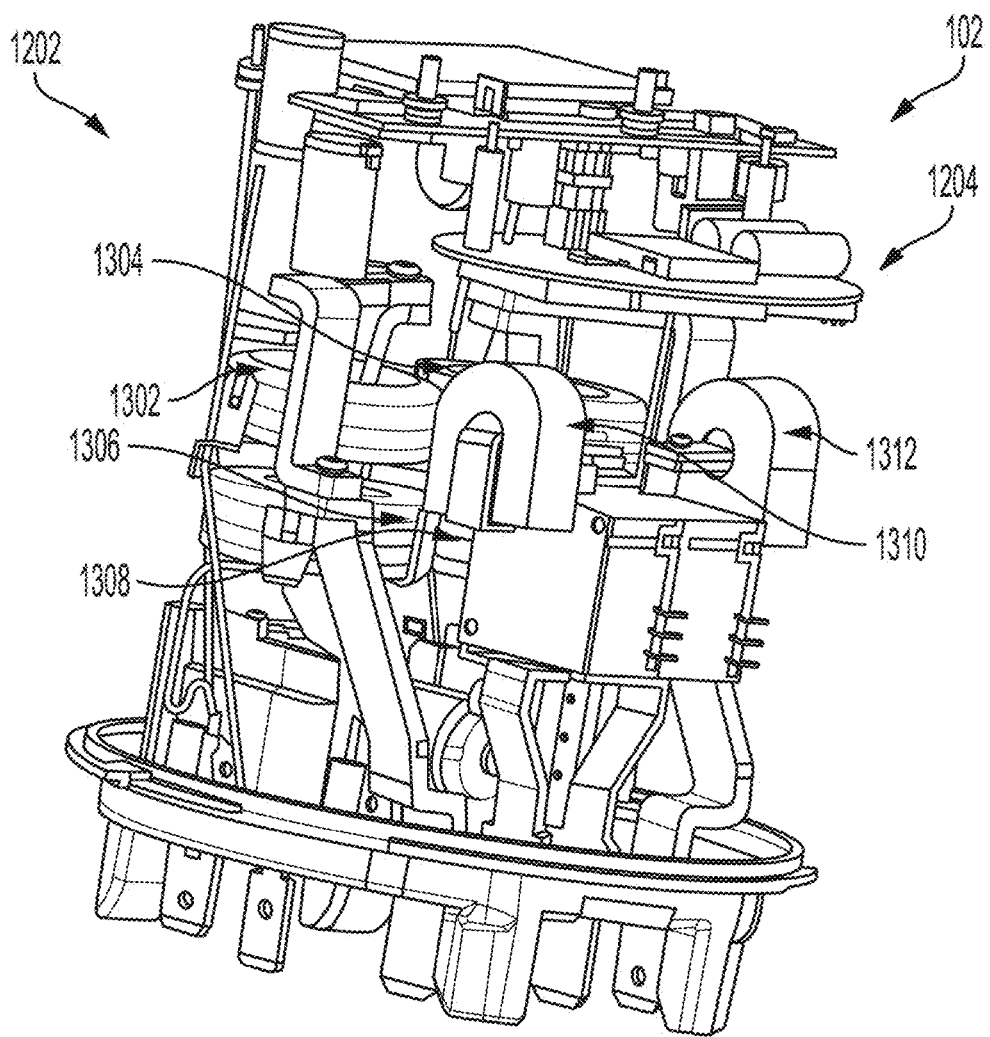
FIG. 13 is an example of a perspective view of the DER meter of FIG. 12 in accordance with various aspects of the present disclosure.

FIG. 13 is an example of a perspective view of the DER meter 102 in accordance with various aspects of the present disclosure. Load current transformers 1302 and 1304, line current transformers 1306 and 1308, and DER current transformers 1310 and 1312 are depicted in the DER meter 102. The load current transformer 1302, the line current transformer 1306, and the DER current transformer 1310 are each located on the left side 1202 of the DER meter 102, and the left side 1202 of the DER meter 102 is associated with the L1 conductors. Further, the load current transformer 1304, the line current transformer 1308, and the DER current transformer 1312 are each located on the right side 1204 of the DER meter 102, and the right side 1004 of the DER meter 102 is associated with the L1 conductors.

Figure 14:
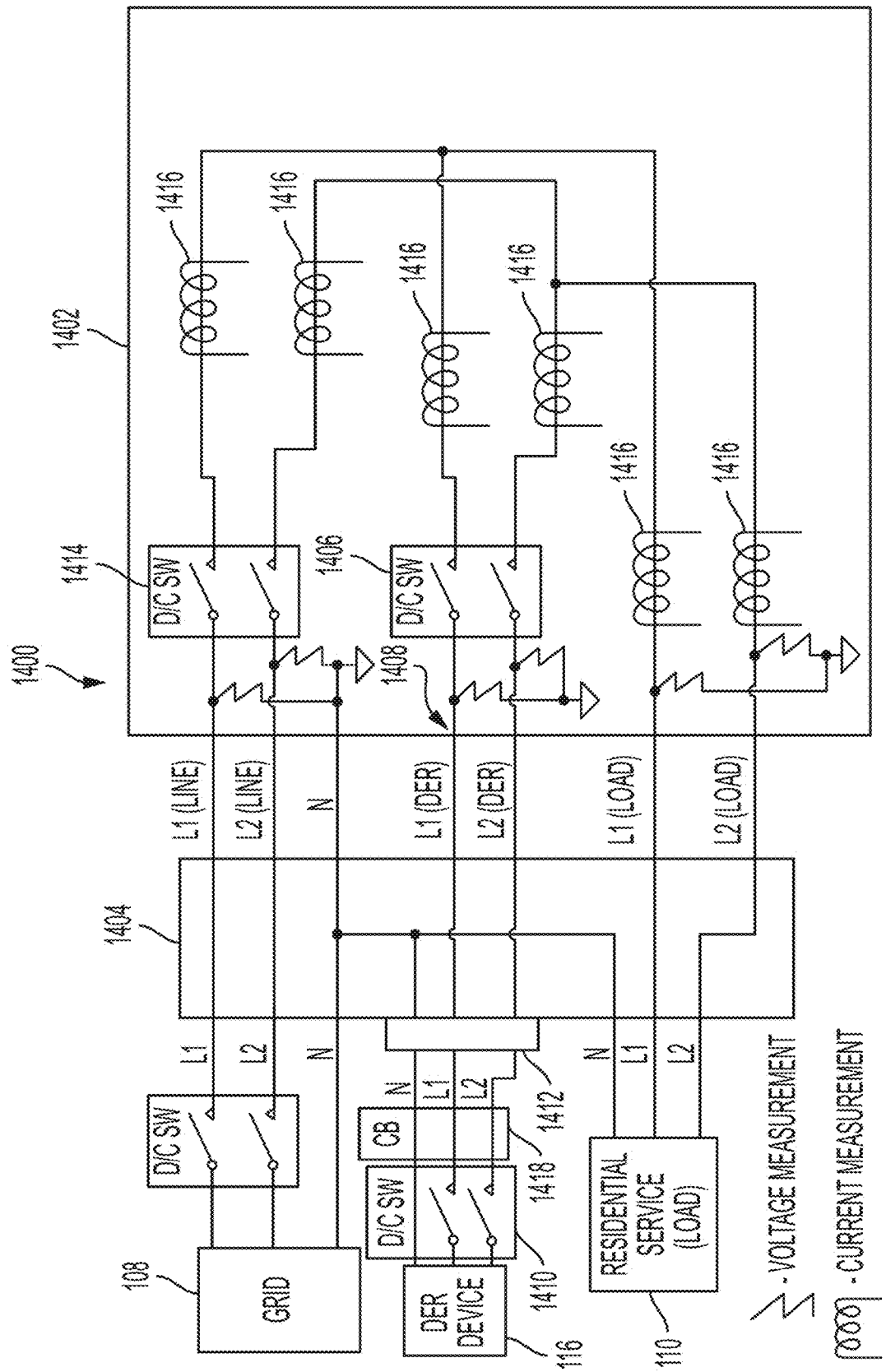
FIG. 14 is a block diagram illustrating electrical connections between a DER meter and a meter socket in accordance with various aspects of the present disclosure.

FIG. 14 is a block diagram 1400 illustrating electrical connections between a DER meter 1402 and a meter socket 1404 in accordance with various aspects of the present disclosure. The DER meter 1402 includes a DER disconnect switch 1406 on an interface 1408 (e.g., a DER port) with DER blades of the DER meter 1402. Since the DER disconnect switch 1406 is included in the DER meter 1402, a head-end system (not shown) may control the DER disconnect switch 1406 by communicating with the DER meter 1402. This allows the head-end system to control the connection of the DER device 116 without having to communicate with an external switch 1410. Exemplary commands for controlling the connection of the DER device 116 include: when the DER device 116 is an electric vehicle (EV) or an EV charger, one or more commands to open the DER disconnect switch 1406 to prevent the EV or EV charger from charging, such as to prevent charging during a time of high demand or during a high rate period; and when the DER device 116 is a solar array or other energy generating device, one or more commands may be sent to the DER meter 1402 to open the DER disconnect switch 1406 when the connection of the DER device 116 is causing power quality issues. In some systems, the DER meter 1402 may communicate with the DER device 116. For example, the DER meter 1402 may communicate with an EV charger to control the charging current.

The block diagram 1400 illustrates one exemplary schematic of the DER meter 1402 connected to the DER socket 1404. The DER device 116 is connected to the DER connector 1412 on the DER socket 1404. The DER meter 1402 includes the DER disconnect switch 1406, as well as a line disconnect switch 1414. The block diagram 1400 also illustrates the DER meter 1402 with two current transformers 1416 on each of the line, load, and DER ports. Other meter designs are possible, including those that use a single current transformer 1416 for measuring current of L1 and L2 for any combination of ports (e.g., line, load, and DER ports). Further, in the block diagram 1400, a circuit breaker 1418 is positioned at the DER connector 1412, as opposed to within the DER meter 102, as depicted in FIG. 1. The DER device 116 may also be connected to a terminal block (not shown) wired to a portion of the DER meter instead of using the DER connector 1412 at the DER socket 1404.

Figure 15:
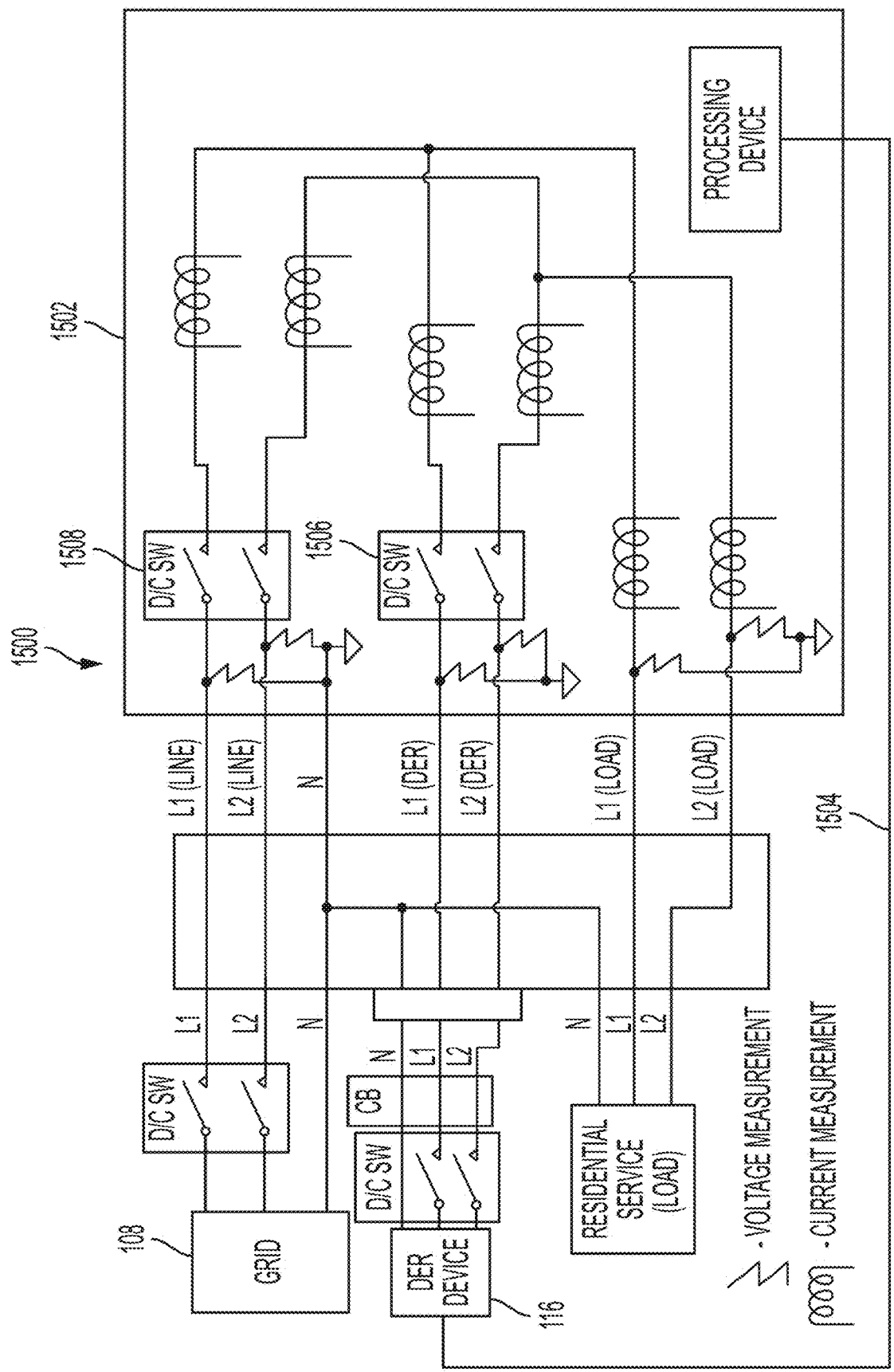
FIG. 15 is a block diagram including a communication channel between a DER meter and a DER device in accordance with various aspects of the present disclosure.

In an example, the DER meter 102 or 1402 may include alternative or additional components to those shown in FIGS. 1 and 14, such as a processing module and a communications module. FIG. 15 is a block diagram 1500 including a communication channel 1504 between a DER meter 1502 and the DER device 116 in accordance with various aspects of the present disclosure. The communications channel 1504 between the DER meter 1502 and the DER device 116 may use any type of communication protocol, including proprietary or non-proprietary protocols. Exemplary protocols include the WiFi, Bluetooth, and Ethernet protocols. The DER meter 1502 may communicate with the DER device 116 to coordinate operations, such as coordinating the control of the DER disconnect switch 1506 and the line disconnect switch 1508 (or a 4-position switch, as described above with respect to FIG. 1) in the DER meter 1502 with control of the operation of the DER device 116.

As an example, if there is an outage on the grid, the disconnect switches 1506 and 1508 may be controlled to enable islanding. In other words, the disconnect switches 1506 and 1508 may be controlled to enable the DER device 116 to provide power to the premises while the premises are disconnected from the grid 108. Islanding and a subsequent reconnection to the grid may rely on a coordinated control of the switches 1506 and 1508. For example, the connection to the grid 108 at the disconnect switch 1508 may remain open until the grid 108 is safe to reconnect. Phase coordination between the DER device 116 and the grid 108 may be needed prior to reconnection to the grid 108 or prior to connecting the DER device 116 to the grid 108 after the DER device 116 has been disabled. Other types of communications between the DER meter 1502 and the DER device 116 include, but are not limited to, communications related to charging rates for an EV or storage battery, enabling an EV (or other type of DER device) to discharge onto the grid, to power parameters, such as power factor and power quality, and to update or correct a power factor or other parameter on the DER device 116.

Figure 16:
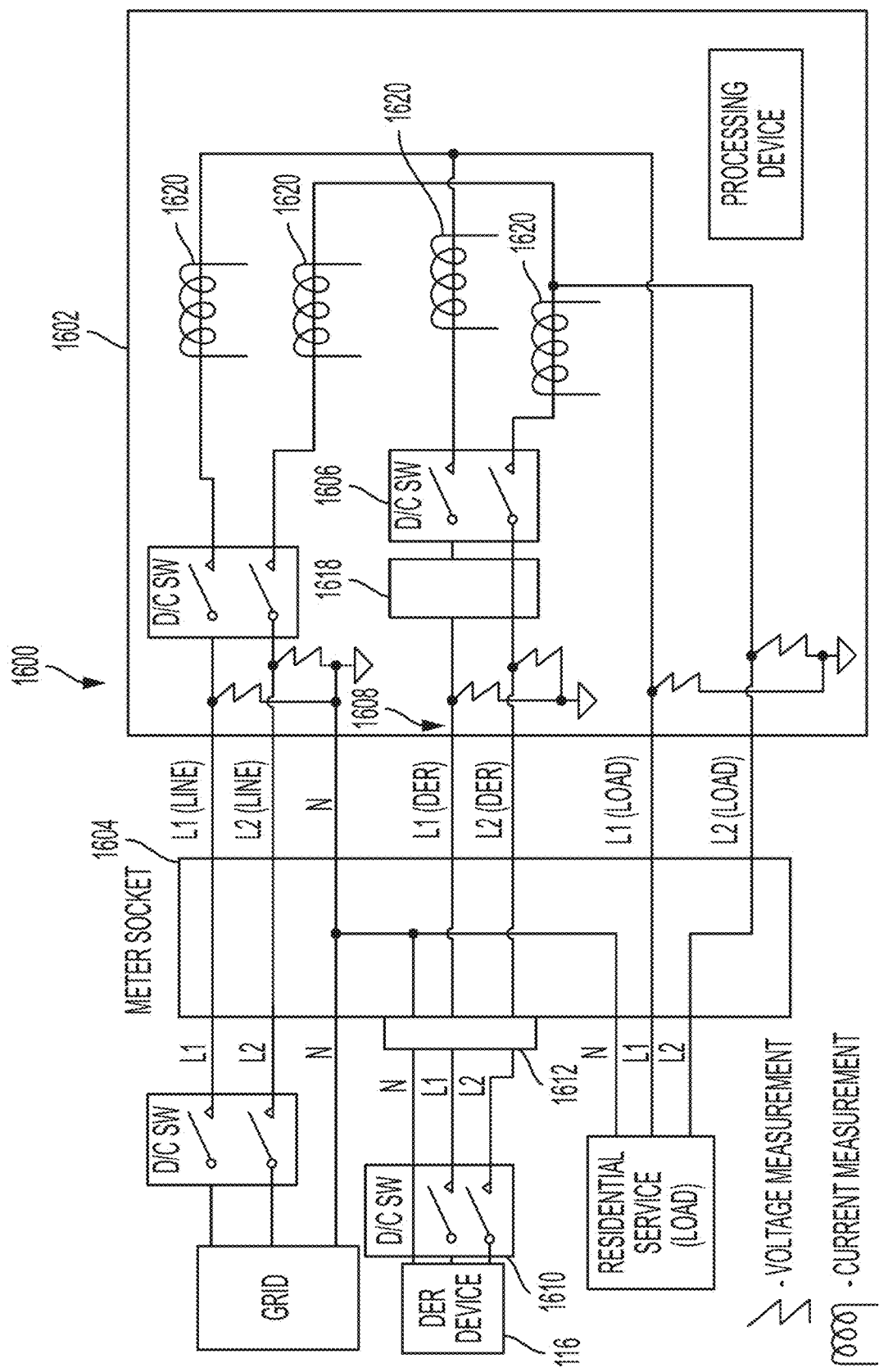
FIG. 16 is a block diagram illustrating electrical connections between a DER meter and a meter socket in accordance with various aspects of the present disclosure.

FIG. 16 is a block diagram 1600 illustrating electrical connections between a DER meter 1602 and a meter socket 1604 in accordance with various aspects of the present disclosure. The DER meter 1602 includes a DER disconnect switch 1606 on an interface 1608 (e.g., a DER port) with DER blades of the DER meter 1602. Since the DER disconnect switch 1606 is included in the DER meter 1602, a head-end system (not shown) may control the DER disconnect switch 1606 by communicating with the DER meter 1602. This allows the head-end system to control the connection of the DER device 116 without having to communicate with an external switch 1610.

The block diagram 1600 illustrates one exemplary schematic of the DER meter 1602 connected to the DER socket 1604. The DER device 116 is connected to the DER connector 1612 on the DER socket 1604. The DER meter 1602 includes the DER disconnect switch 1606, as well as a circuit breaker 1618. The circuit breaker 1618 may disconnect the DER device 116 from the DER meter 102 upon occurrence of an electrical fault. The circuit breaker 1618 may be integrated into the DER meter 102. Additionally, the circuit breaker 1618 may be controlled locally or remotely. In some examples, the DER disconnect switch 1606 may be used as a circuit breaker in place of the circuit breaker 1618.

The block diagram 1600 also illustrates the DER meter 1602 with two current transformers 1620 on each of the line and DER ports. Without current transformers 1620 on the load ports of the DER meter 1602, the load current may be calculated separately for each phase by taking an algebraic sum of the line current and the DER device current on a sample-by-sample basis. Other meter designs are possible, including those that use a single current transformer 1620 for measuring current of L1 and L2 for any combination of ports (e.g., line, load, and DER ports).

Figure 17:
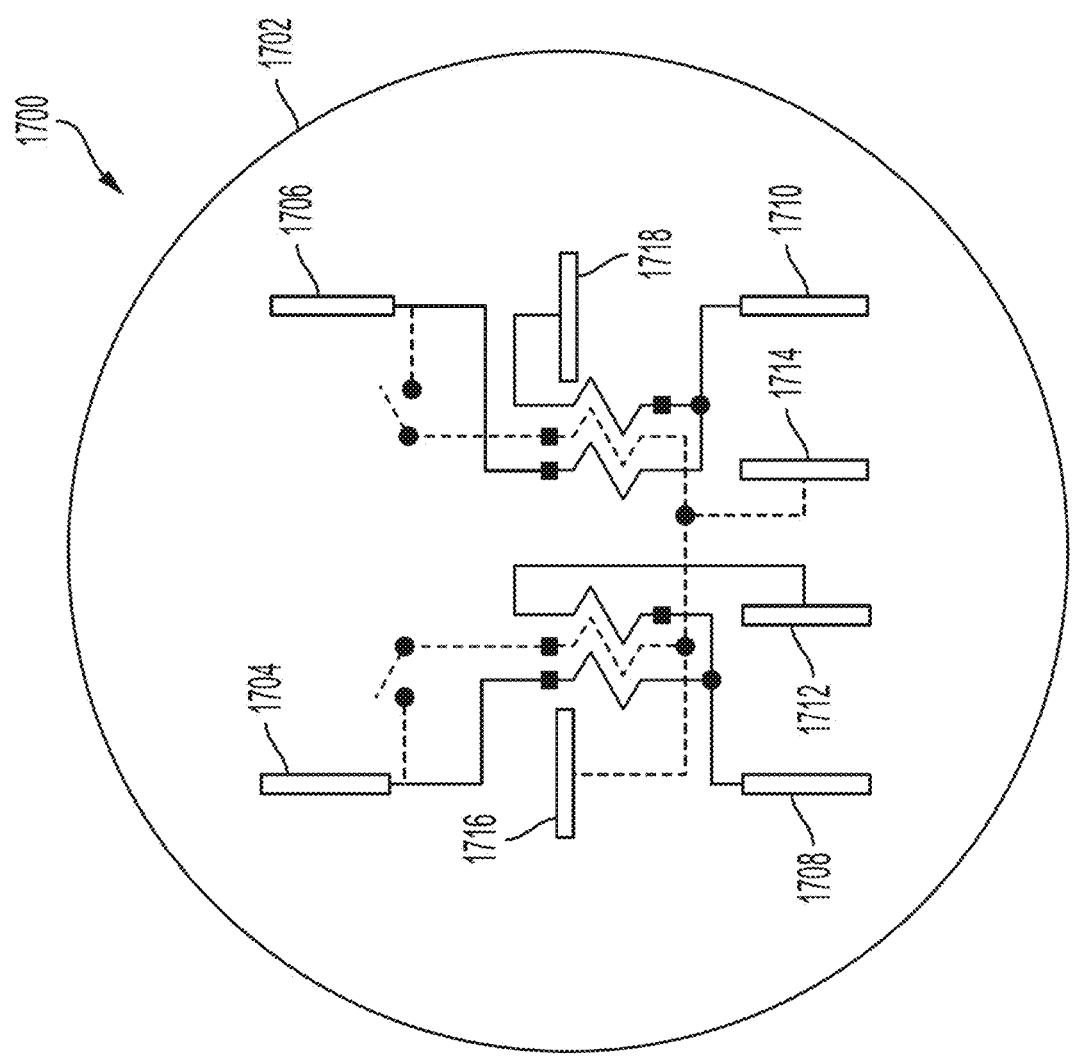
FIG. 17 is a diagram of blades of a multi-port meter in accordance with various aspects of the present disclosure.
Figure 18:
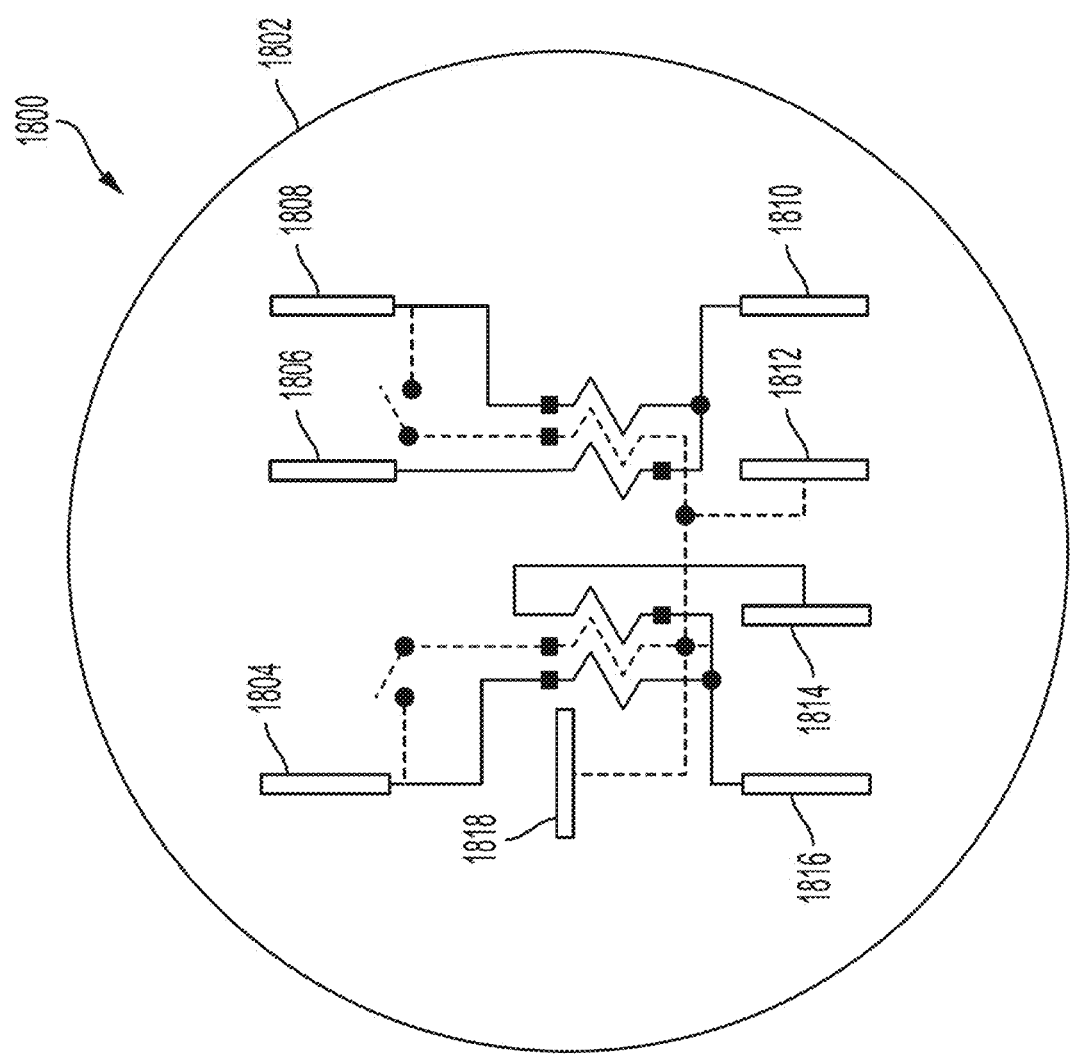
FIG. 18 is an additional diagram of blades of a multi-port meter in accordance with various aspects of the present disclosure.

FIG. 17 is a diagram 1700 of blades 1704-1718 of a multi-port meter 1702 in accordance with various aspects of the present disclosure. The blades 1704-1718 may arranged in such a manner to fit with a specific DER socket 104 arrangement. In an example, the blades 1714 and 1716 may connect to the neutral wire N, while the blades 1704, 1706, 1708, 1710, 1712, and 1718 may each connect to a line associated with one of the grid 108, the DER device 116, or the electrical service 110. Similarly, FIG. 18 is a diagram 1800 of blades 1804-1818 of a multi-port meter 1802 in accordance with various aspects of the present disclosure. The blades 1804-118 may arranged in such a manner to fit with a specific DER socket 104 arrangement. In an example, the blades 1812 and 1818 may connect to the neutral wire N, while the blades 1804, 1806, 1808, 1810, 1814, and 1816 may each connect to a line associated with one of the grid 108, the DER device 116, or the electrical service 110.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:
1. A system, comprising:
an electric meter socket, comprising:
at least one first connection path within the electric meter socket configured to form a first electrical connection between a distributed energy resource (DER) meter and line voltage wirings from an electric distribution system;
at least one second connection path within the electric meter socket configured to form a second electrical connection between the DER meter and neutral wires of the electric distribution system, a DER device, and a load;
at least one third connection path within the electric meter socket configured to form a third electrical connection between the DER meter and output voltage wirings of the DER device; and
a DER connector positioned on a side of the electric meter socket, wherein the DER connector is configured to receive the output voltage wirings of the DER device to electrically couple the output voltage wirings to the at least one third connection path; and
an electric meter, comprising:
a plurality of connectors configured to form electrical connections to a first plurality of mating connectors of the electric meter socket, wherein at least one electrical connection to the first plurality of mating connectors is configured to connect with the at least one second connection path formed with the neutral wires; and a plurality of measurement devices configured to measure electrical characteristics of voltage and current waveforms provided to the electric meter from the electric distribution system and the DER device, wherein the neutral wires provide an electrical reference point for measurement of the voltage waveforms.

2. The system of claim 1, further comprising:
at least one fourth connection path within the electric meter socket configured to form a fourth electrical connection between the DER meter and the load.

3. The system of claim 1, wherein the at least one first connection path comprises a plurality of first connection paths, and wherein each connection path of the plurality of first connection paths corresponds to line voltage wirings of the electric distribution system with voltages having different electrical phases.

4. The system of claim 1, further comprising:
a controllable electrical disconnect switch configured to connect and disconnect the DER device from the electric distribution system based on power production or consumption requirements of the electric distribution system and the DER device.

5. The system of claim 4, wherein the controllable electrical disconnect switch is configured to connect and disconnect the DER device from the electric distribution system based on a command received over from the DER meter, to disconnect the DER device from the electric distribution system on an occurrence of an electrical fault, or a combination thereof.

6. The system of claim 1, wherein the DER connector is further configured to electrically couple the electric meter socket to the DER device while the DER meter is electrically coupled to the electric meter socket.

7. A system, comprising:
an electric meter;
an electric meter socket configured to mate with the electric meter, wherein the electric meter socket comprises:
at least one first connection path within the electric meter socket configured to form a first electrical connection between the electric meter and line voltage wirings of an electric distribution system;
at least one second connection path within the electric meter socket configured to form a second electrical connection between the electric meter and neutral wires of the electric distribution system, a distributed energy resource (DER) device, and a load;
at least one third connection path within the electric meter socket configured to form a third electrical connection between the electric meter and output voltage wirings of the DER device; and
a DER connector positioned on a side of the electric meter socket, wherein the DER connector is configured to receive the output voltage wirings of the DER device to electrically couple the output voltage wirings to the at least one third connection path;
a controllable electrical disconnect switch configured to connect and disconnect the DER device from the electric distribution system based on power production or consumption requirements of the electric distribution system and the DER device; and
a plurality of voltage transducers positionable at the electric meter and configured to measure electrical characteristics of voltage provided to the load, wherein each of the plurality of voltage transducers is configured to individually measure voltage characteristics of one of a plurality of line voltages provided from the electric distribution system or an output voltage provided by the DER device,
wherein each of the plurality of line voltages provided from the electric distribution system has a different electrical phase, and
wherein measurements of the voltage characteristics are performed between the line voltage wirings of the electric distribution system and the neutral wires.

8. The system of claim 7, further comprising a plurality of current measurement devices configured to measure electrical characteristics of current waveforms provided to the load.

9. The system of claim 8, wherein the plurality of current measurement devices comprises a plurality of current transducers, and wherein each of the plurality of current transducers is configured to individually measure current provided by the line voltage wirings of the electric distribution system or the output voltage wirings of the DER device.

10. The system of claim 7, wherein the controllable electrical disconnect switch comprises a 4-position switch comprising:
a first position electrically connecting the electric distribution system, the DER device, and the load;
a second position electrically connecting the electric distribution system and the load while the DER device is disconnected;
a third position electrically connecting the load and the DER device while the electric distribution system is disconnected; and
a fourth position that disconnects the electric distribution system, the DER device, and the load.

11. A system for connecting and metering a distributed energy resource (DER) device, the system comprising:
an electric meter comprising:
at least one controllable electrical disconnect switch configured to connect and disconnect the DER device from an electric distribution system based on power production or consumption requirements of the electric distribution system and the DER device, wherein the at least one controllable electrical disconnect switch comprises a 4-position switch comprising:
a first position electrically connecting the electric distribution system, the DER device, and a load;
a second position electrically connecting the electric distribution system and the load while the DER device is disconnected;
a third position electrically connecting the load and the DER device while the electric distribution system is disconnected; and
a fourth position that disconnects the electric distribution system, the DER device, and the load; and
an electric meter socket configured to electrically couple to the electric meter, wherein the electric meter socket comprises:
at least one first connection path within the electric meter socket configured to form a first electrical connection between the electric meter and line voltage wirings of the electric distribution system;
at least one second connection path within the electric meter socket configured to form a second electrical connection between the electric meter and neutral wires of the electric distribution system, the DER device, and the load;
at least one third connection path within the electric meter socket configured to form a third electrical connection between the electric meter and output voltage wirings of the DER device; and at least one fourth connection path within the electric meter socket configured to form a fourth electrical connection between the electric meter and the load.

12. The system of claim 11, wherein the at least one first connection path comprises a first plurality of connection paths, and wherein each of the first plurality of connection paths corresponds to additional line voltage wirings of the electric distribution system with voltages having different electrical phases.

13. The system of claim 11, wherein the electric meter socket further comprises:

a second controllable electrical disconnect switch configured to connect and disconnect the DER device from the electric distribution system based on power production or consumption requirements of the electric distribution system and the DER device.

14. The system of claim 11, wherein the electric meter socket further comprises:

a DER connector positioned on a side of the electric meter socket, wherein the DER connector is configured to receive the output voltage wirings of the DER device to electrically couple the output voltage wirings to the at least one third connection path.

15. The system of claim 11, wherein the electric meter further comprises:

a circuit breaker configured to disconnect the DER device from the electric distribution system on an occurrence of an electrical fault.

16. The system of claim 11, wherein the electric meter further comprises:

a plurality of connectors configured to form electrical connections to a first plurality of mating connectors that are configured to interact with the electric meter socket, wherein at least one electrical connection to the first plurality of mating connectors is configured to connect with the at least one second connection path formed with the neutral wires; and a plurality of measurement devices configured to measure electrical characteristics of voltage and current waveforms provided to the electric meter from the electric distribution system and the DER device, wherein the neutral wires provide an electrical reference point for measurement of the voltage waveforms.

17. The system of claim 16, wherein the plurality of measurement devices comprises measurement devices configured to measure electrical characteristics of voltage and current waveforms provided to the load.

18. The system of claim 16, wherein the plurality of measurement devices comprises a plurality of current transducers, and wherein the plurality of current transducers is configured to individually measure (i) current consumed by the load on each of the line voltage wirings connected to the load and (ii) current provided by the line voltage wirings of the electric distribution system and the output voltage wirings of the DER device.

\* \* \* \* \*